United States Patent [19]
Mick et al.

[11] Patent Number: 6,115,320
[45] Date of Patent: Sep. 5, 2000

[54] SEPARATE BYTE CONTROL ON FULLY SYNCHRONOUS PIPELINED SRAM

[75] Inventors: John R. Mick, San Jose; Mark W. Baumann, Campbell, both of Calif.

[73] Assignee: Integrated Device Technology, Inc., Santa Clara, Calif.

[21] Appl. No.: 09/028,206

[22] Filed: Feb. 23, 1998

[51] Int. Cl.$^7$ ........................................ G11C 8/00
[52] U.S. Cl. ................................. 365/233; 365/230.08
[58] Field of Search ............................... 365/233, 189.02, 365/230.02, 240, 189.12, 189.09, 230.08

[56] References Cited

U.S. PATENT DOCUMENTS

| | | | |
|---|---|---|---|
| 4,882,709 | 11/1989 | Wyland | 365/189.02 |
| 5,515,325 | 5/1996 | Wada | 365/189.01 |
| 5,526,320 | 6/1996 | Zagar et al. | 365/233.5 |
| 5,546,344 | 8/1996 | Fawcett | 365/189.05 |
| 5,568,430 | 10/1996 | Ting | 365/189.05 |
| 5,577,236 | 11/1996 | Johnson et al. | 395/551 |
| 5,617,362 | 4/1997 | Mori et al. | 365/189.05 |
| 5,644,729 | 7/1997 | Amini et al. | 395/250 |
| 5,652,724 | 7/1997 | Manning | 365/189.05 |
| 5,659,696 | 8/1997 | Amini et al. | 395/412 |
| 5,663,901 | 9/1997 | Wallace et al. | 365/52 |
| 5,675,549 | 10/1997 | Ong et al. | 365/233.5 |
| 5,699,317 | 12/1997 | Sartore et al. | 365/230.06 |
| 5,828,606 | 10/1998 | Mick | 365/189.05 |
| 5,838,631 | 11/1998 | Mick | 365/233 |
| 5,841,732 | 11/1998 | Mick | 365/233 |
| 5,875,151 | 2/1999 | Mick | 365/233 |

OTHER PUBLICATIONS

Prince, Betty, *Semiconductor Memories*, Second Edition, 467–472 (John Wiley & Sons ed., 1991) (1983).

*Primary Examiner*—A. Zarabian
*Attorney, Agent, or Firm*—Skjerven Morrill MacPherson Franklin & Friel

[57] ABSTRACT

A memory system including a memory array, an input circuit and a logic circuit is presented. The input circuit is coupled to receive a memory address and a set of individual write controls for each byte of data word. During a write operation, the input circuit also receives the corresponding write data to be written into the SRAM. The logic circuit causes the write data and write control information to be stored in the input circuit for the duration of any sequential read operations immediately following the write operation and then to be read into memory during a subsequent write operation. During the read operation, data which is stored in the write data storage registers prior to being read into the memory can be read out from the memory system should the address of one or more read operations equal the address of the data to be written into the memory while temporarily stored in the write data storage registers.

30 Claims, 22 Drawing Sheets

Microfiche Appendix Included
(2 Microfiche, 116 Pages)

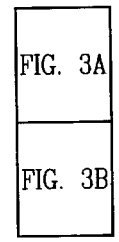

KEY TO FIG. 3

S/D=H
CEN=L
Single Pipeline Operation

| Cycle n+ | 0 | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|---|
| Operation | W | W | W | W | R | R | W | W | R | R | W | W | W | R | W | R | W | R | W |
| CLK | ⎍⎍⎍⎍⎍⎍⎍⎍⎍⎍⎍⎍⎍⎍⎍⎍⎍⎍⎍ | | | | | | | | | | | | | | | | | | |
| Address | $a_0$ | $a_1$ | $a_2$ | $a_3$ | $a_4$ | $a_3$ | $a_5$ | $a_6$ | $a_5$ | $a_6$ | $a_7$ | $a_8$ | $a_9$ | $a_{10}$ | $a_{11}$ | $a_{12}$ | $a_{13}$ | $a_{14}$ | $a_{15}$ |
| Data I/O |  | $d_0$ | $d_1$ | $d_2$ | $d_3$ | $Da_4^*$ | $d_3^*$ | $d_5$ | $d_6$ | $Da_5^*$ | † | $d_7$ | $d_8$ | $d_9$ | $Da_{10}^*$ | $d_{11}$ | $Da_{12}^*$ | $d_{13}$ | $Da_{14}^*$ |
| OE |  |  |  | H | H | H | L | L | H | H | L | H | H | H | L | H | L | H | L |
| CS | L | L | L | L | L | L | L | L | L | L | L | L | L | L | L | L | L | L | L |
| GW | L | L | H | H | L | H | L | H | H | H | L | L | H | L | H | L | H | L |  |
| BW1 | L | H | L | H | H | H | L | L | H | H | L | L | H | L | H | L | H | L |  |
| BW2 | L | H | L | H | H | H | L | L | H | H | L | L | H | L | H | L | H | L |  |
| BW3 | L | L | L | L | H | H | L | H | H | H | L | L | H | L | H | L | H | L |  |
| BW4 | L | L | L | L | H | H | L | H | H | H | L | L | H | L | H | L | H | L |  |
| A1 | $a_0$ | $a_1$ | $a_2$ | $a_3$ | $a_4$ | $a_3$ | $a_5$ | $a_6$ | $a_5$ | $a_6$ | $a_7$ | $a_8$ | $a_9$ | $a_{10}$ | $a_{11}$ | $a_{12}$ | $a_{13}$ | $a_{14}$ |  |
| A2 |  | $a_0$ | $a_1$ | $a_2$ | $a_3$ | $a_3$ | $a_3$ | $a_5$ | $a_6$ | $a_6$ | $a_6$ | $a_7$ | $a_8$ | $a_9$ | $a_9$ | $a_{11}$ | $a_{11}$ | $a_{13}$ |  |
| RCS1 | L | L | L | L | L | L | L | L | L | L | L | L | L | L | L | L | L | L |  |
| G1 | L | L | H | H | L | H | L | H | H | H | L | L | H | L | H | L | H |  |  |
| BWA | L | H | L | H | H | H | L | L | H | H | L | L | H | L | H | L | H |  |  |
| BWB | L | H | L | H | H | H | L | L | H | H | L | L | H | L | H | L | H |  |  |
| BWC | L | L | L | L | H | H | L | H | H | H | L | L | H | L | H | L | H |  |  |
| BWD | L | L | L | L | H | H | L | H | H | H | L | L | H | L | H | L | H |  |  |
| RBW1 |  | H | H | H | L | L | H | H | H | H | H | H | H | H | H | H |  |  |  |
| RBW2 |  | H | H | H | L | L | H | H | H | H | H | H | H | H | H | H |  |  |  |
| RBW3 |  | H | H | H | H | H | H | L | L | H | H | H | H | H | H | H |  |  |  |
| RBW4 |  | H | H | H | H | H | H | L | L | H | H | H | H | H | H | H |  |  |  |
| R1 | H | H | H | H | L | L | H | H | L | L | H | H | H | L | H | L | H | L |  |
| W1 | L | L | L | L | H | H | L | L | H | H | L | L | L | H | L | H | L | H |  |
| EN1 | L | L | L | L | H | H | L | L | H | H | L | L | L | H | L | H | L | H |  |
| EN2 | L | L | L | L | H | H | L | L | H | H | L | L | L | H | L | H | L | H |  |
| DB | L | L | L | L | H | H | L | L | H | H | L | L | L | H | L | H | L | H |  |

* chip outputs

† output part of the word from the memory array and part of the word from the stored logic circuit

FIG. 3A

| | | | | | | | | | | | | | | | | | |
|---|---|---|---|---|---|---|---|---|---|---|---|---|---|---|---|---|---|
| WB1 | Y | Y | Y | N | N | N | Y | N | N | Y | Y | Y | N | Y | N | Y | N |
| WB2 | Y | Y | Y | N | N | N | Y | N | N | Y | Y | Y | N | Y | N | Y | N |
| WB3 | Y | Y | Y | N | N | Y | Y | N | N | N | Y | Y | N | Y | N | Y | N |
| WB4 | Y | Y | Y | N | N | Y | Y | N | N | N | Y | Y | N | Y | N | Y | N |
| D1 | $d_0$ | $d_1$ | $d_2$ | $d_3$ | $d_3$ | $d_3$ | $d_5$ | $d_6$ | $d_6$ | $d_6$ | $d_7$ | $d_8$ | $d_9$ | $d_9$ | $d_{11}$ | $d_{11}$ | $d_{13}$ |
| Eq3 | L | L | L | L | H | L | L | H | L | L | L | L | L | L | L | L | L |
| DT(1) | $Da_0^{(1)}$ | $Da_1^1$ | $Da_2^1$ | $Da_4^1$ | $d_3^1$ | $Da_3$ | $Da_5$ | $Da_5^1$ | $d_6^1$ | $Da_6$ | $Da_7$ | $Da_8$ | $Da_{10}$ | $Da_9$ | $Da_{12}$ | $Da_{11}$ | $Da_{14}$ |
| DT(2) | $Da_0^{(2)}$ | $Da_1^2$ | $Da_2^2$ | $Da_4^2$ | $d_3^2$ | | | | $d_6^2$ | | | | | | | | |
| DT(3) | $Da_0^{(3)}$ | $Da_1^3$ | $Da_2^3$ | $Da_4^3$ | $d_3^3$ | | | | $Da_6^3$ | | | | | | | | |
| DT(4) | $Da_0^{(4)}$ | $Da_1^4$ | $Da_2^4$ | $Da_4^4$ | $d_3^4$ | | | | $Da_6^4$ | | | | | | | | |
| SRAM addr. | $a_0$ | $a_1$ | $a_2$ | $a_4$ | $a_3$ | $a_3$ | $a_5$ | $a_5$ | $a_6$ | $a_6$ | $a_7$ | $a_8$ | $a_{10}$ | $a_9$ | $a_{12}$ | $a_{11}$ | $a_{14}$ |
| DIN | $d_0$ | $d_1$ | $d_2$ | $d_3$ | $d_3$ | $d_3$ | $d_5$ | $d_6$ | $d_6$ | $d_6$ | $d_7$ | $d_8$ | $d_9$ | $d_9$ | $d_{10}$ | $d_{11}$ | $d_{13}$ |
| DOUT | $Da_0$ | $Da_1$ | $Da_2$ | $Da_4$ | $Da_3$ | $Da_3$ | $Da_5$ | $Da_5$ | $Da_6$ | $Da_6$ | $Da_7$ | $Da_8$ | $Da_{10}$ | $Da_9$ | $Da_{12}$ | $Da_{11}$ | $Da_{14}$ |
| C1(1) | L | L | L | L | L | L | L | L | H | L | L | L | L | L | L | L | L |
| C1(2) | L | L | L | L | L | L | L | L | H | L | L | L | L | L | L | L | L |
| C1(3) | L | L | L | L | H | L | L | L | L | L | L | L | L | L | L | L | L |
| C1(4) | L | L | L | L | H | L | L | L | L | L | L | L | L | L | L | L | L |

Write $d_0 \rightarrow a_0$
Write $d_1 \rightarrow a_1$
Write $d_2 \rightarrow a_2$
Output $Da_4$
Output Part of $d_3$
Write $d_3 \rightarrow a_3$
Write $d_5 \rightarrow a_5$
Output $Da_5$
Output $Da_6$
Write $d_6^{(1-2)} \rightarrow a_6$
Write $d_7 \rightarrow a_7$

FIG. 3B

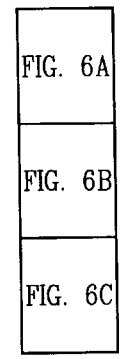

KEY TO FIG. 6

Double Pipeline Operation
S/D=L
CEN=L

| Cycle n+ | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| Operation | W | W | W | W | R | R | W | W | R | R | W | W | W | R | R | W | R | W | R | W | R | W | R |
| CLK* | ⊔⊔⊔⊔⊔⊔⊔⊔⊔⊔⊔⊔⊔⊔⊔⊔⊔⊔⊔⊔⊔⊔⊔ | | | | | | | | | | | | | | | | | | | | | | |
| Address* | $a_0$ | $a_1$ | $a_2$ | $a_3$ | $a_4$ | $a_3$ | $a_5$ | $a_6$ | $a_5$ | $a_6$ | $a_7$ | $a_8$ | $a_8$ | $a_8$ | $a_8$ | $a_9$ | $a_{10}$ | $a_{11}$ | $a_{12}$ | $a_{13}$ | $a_{14}$ | $a_{15}$ | $a_{16}$ |
| Data I/O* |  | $d_0$ | $d_1$ | $d_2$ | $d_3$ | $Da_4^*$ | * | $d_5$ | $d_6$ | * | * | $d_7$ | $d_8$ | $d_8$ | * | * | $d_9$ | * | $d_{11}$ | * | $d_{13}$ | * | $d_{15}$ |
| OE* |  | H | H | H | H | L | L | H | H | L | L | H | H | H | L | L | H | L | H | L | H | L | H |
| CS* | L | L | L | L | L | L | L | L | L | L | L | L | L | L | L | L | L | L | L | L | L | L | L |
| GW* | L | L | H | H | L | H | L | H | H | H | L | H | H | H | L | H | L | H | L | H | L | H | L |
| BW1* | L | H | L | H | H | L | H | L | H | H | L | L | H | H | H | L | H | L | H | L | H | L | H |
| BW2* | L | H | L | H | H | H | L | L | H | H | L | L | H | H | H | L | H | L | H | L | H | L | H |
| BW3* | L | L | L | L | H | H | L | H | H | H | L | H | L | H | H | L | H | L | H | L | H | L | H |
| BW4* | L | L | L | L | H | H | L | H | H | H | L | H | L | H | H | L | H | L | H | L | H | L | H |
| A1 |  | $a_0$ | $a_1$ | $a_2$ | $a_3$ | $a_4$ | $a_3$ | $a_5$ | $a_6$ | $a_5$ | $a_6$ | $a_7$ | $a_8$ | $a_8$ | $a_8$ | $a_8$ | $a_9$ | $a_{10}$ | $a_{11}$ | $a_{12}$ | $a_{13}$ | $a_{14}$ | $a_{15}$ | $a_{16}$ |
| A2 |  |  | $a_0$ | $a_1$ | $a_2$ | $a_3$ | $a_3$ | $a_3$ | $a_5$ | $a_6$ | $a_6$ | $a_6$ | $a_7$ | $a_8$ | $a_8$ | $a_8$ | $a_8$ | $a_9$ | $a_9$ | $a_{11}$ | $a_{11}$ | $a_{13}$ | $a_{13}$ | $a_{15}$ |
| A3 |  |  |  | $a_0$ | $a_1$ | $a_2$ | $a_2$ | $a_2$ | $a_3$ | $a_5$ | $a_5$ | $a_5$ | $a_6$ | $a_7$ | $a_8$ | $a_8$ | $a_8$ | $a_8$ | $a_8$ | $a_9$ | $a_9$ | $a_{11}$ | $a_{11}$ | $a_{13}$ |
| RCS1 |  | L | L | L | L | L | L | L | L | L | L | L | L | L | L | L | L | L | L | L | L | L | L |
| RCS2 |  |  | L | L | L | L | L | L | L | L | L | L | L | L | L | L | L | L | L | L | L | L | L |
| G1 |  | L | L | H | H | L | H | L | H | H | H | L | H | H | H | L | H | L | H | L | H | L | H |
| BWA |  | L | H | L | H | H | L | L | H | H | L | L | H | H | H | L | H | L | H | L | H | L | H |
| BWB |  | L | H | L | H | H | L | L | H | H | L | L | H | H | H | L | H | L | H | L | H | L | H |
| BWC |  | L | L | L | H | H | L | H | H | H | L | H | L | H | H | L | H | L | H | L | H | L | H |
| BWD |  | L | L | L | H | H | L | H | H | H | L | H | L | H | H | L | H | L | H | L | H | L | H |

FIG. 6A

| Signal | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| RBW1 | H | H | H | L | L | L | H | H | H | H | H | L | L | L | H | H | H | H | H | H |
| RBW2 | H | H | H | L | L | L | H | H | H | H | H | L | L | L | H | H | H | H | H | H |
| RBW3 | H | H | H | H | H | H | L | L | L | H | L | H | H | H | H | H | H | H | H | H |
| RBW4 | H | H | H | H | H | H | L | L | L | H | L | H | H | H | H | H | H | H | H | H |
| DBW1 |  | H | H | H | H | H | L | H | H | H | H | H | H | H | L | L | H | H | H | H |
| DBW2 |  | H | H | H | H | H | L | H | H | H | H | H | H | H | L | L | H | H | H | H |
| DBW3 |  | H | H | H | H | H | H | H | H | L | H | L | L | L | H | H | H | H | H | H |
| DBW4 |  | H | H | H | H | H | H | H | H | L | H | L | L | L | H | H | H | H | H | H |
| R1 | H | H | H | H | L | L | H | H | L | L | H | H | H | L | L | H | L | H | L | H | L |
| R2 |  | H | H | H | H | L | L | H | H | L | L | H | H | H | L | L | H | L | H | L | H |
| W1 | L | L | L | L | H | H | L | L | H | H | L | L | L | H | H | L | H | L | H | L | H |
| W2 |  | L | L | L | L | H | H | L | L | H | H | L | L | L | H | H | L | H | L | H | L |
| EN1 | L | L | L | L | H | H | L | L | H | H | L | L | L | H | H | L | H | L | H | L | H |
| EN2 |  | L | L | L | L | H | H | L | L | H | H | L | L | L | H | H | L | H | L | H | L |
| DB |  | L | L | L | L | H | H | L | L | H | H | L | L | L | H | H | L | H | L | H | L |
| WB1 |  | Y | Y | N | N | Y | N | N | N | Y | Y | Y | N | N | Y | N | Y | N | Y | N | Y | N |
| WB2 |  | Y | Y | N | N | Y | N | N | N | Y | Y | Y | N | N | Y | N | Y | N | Y | N | Y | N |
| WB3 |  | Y | Y | N | N | Y | Y | N | N | Y | N | Y | N | N | N | Y | N | Y | N | Y | N |
| WB4 |  | Y | Y | N | N | Y | Y | N | N | Y | N | Y | N | N | N | Y | N | Y | N | Y | N |
| D1 |  | d0 | d1 | d2 | d3 | d3 | d3 | d5 | d6 | d6 | d6 | d7 | d8 | d8B | d8B | d8B | d9 | d9 | d11 | d11 | d13 | d13 |
| D2 |  |  | d0 | d1 | d2 | d2 | d2 | d3 | d5 | d5 | d5 | d6 | d7 | d8A | d8A | d8A | d8B | d8B | d9 | d9 | d11 | d11 |
| EQ3 | L | L | L | L | L | H | L | L | H | L | H | H | H | L | L | L | L | L | L | L |
| EQ4 |  | L | L | L | L | L | L | L | H | L | L | L | H | H | L | L | L | L | L | L | L |
| C2 (1) |  | L | L | L | L | L | L | L | L | L | L | L | H | L | L | L | L | L | L | L | L |
| (2) |  | L | L | L | L | L | L | L | L | L | L | L | H | L | L | L | L | L | L | L | L |
| (3) |  | L | L | L | H | L | L | L | L | L | L | L | L | L | L | L | L | L | L | L | L |
| (4) |  | L | L | L | H | L | L | L | L | L | L | L | L | L | L | L | L | L | L | L | L |
| C3 (1) | L | L | L | L | L | L | L | L | H | H | L | L | L | H | L | L | L | L | L | L | L |
| (2) | L | L | L | L | L | L | L | L | H | H | L | L | L | H | L | L | L | L | L | L | L |
| (3) | L | L | L | L | L | H | L | L | H | L | L | L | L | L | H | L | L | L | L | L | L |
| (4) | L | L | L | L | L | H | L | L | H | L | L | L | L | L | H | L | L | L | L | L | L |

FIG. 6B

| C4 (1) | L | L | L | L | L | L | L | L | L | L | L | H | L | L | L | L | L | L | L | L |
|---|---|---|---|---|---|---|---|---|---|---|---|---|---|---|---|---|---|---|---|---|
| (2) | L | L | L | L | L | L | L | L | L | L | L | H | L | L | L | L | L | L | L | L |
| (3) | L | L | L | L | L | L | L | L | L | L | L | H | L | L | L | L | L | L | L | L |
| (4) | L | L | L | L | L | L | L | L | L | L | L | H | L | L | L | L | L | L | L | L |
| SRAM addr. | a0 | a1 | a4 | a3 | a2 | a3 | a5 | a6 | a5 | a6 | a7 | a8 | a8 | a8 | a10 | a8 | a12 | a9 | a14 | a11 | a16 |
| DIN | d0 | d1 | d2 | d2 | d2 | d3 | d5 | d5 | d5 | d6 | d7 | d8$^A$ | d8$^A$ | d8$^A$ | d8$^B$ | d8$^B$ | d9 | d9 | d11 | d11 | d13 |
| DOUT | Da0 | Da1 | Da4 | Da3 | Da2 | Da3 | Da5 | Da6 | Da5 | Da6 | Da7 | Da8 | Da8 | Da8 | Da10 | Da8 | Da12 | Da9 | Da14 | Da11 | Da16 |

(Figure 6C — timing diagram with DO(1)-(4) and DT(1)-(4) signal rows and annotations:
Writes d0 into a0; Writes d1 into a1; Hold while Read is processed; Output Da4; Output Word consisting of Byte 1-2 of Da3 and Byte 3-4 of d3; Write last two bytes of d3 into a3; Hold while Read is processed; Output d5 From Logic Circuit; Output a6 and Write d5 into a5; Write Bytes 1-2 of d6 into a6; Write d7 into a7; Process Read; Output D(a8) as (d8, d8, d8, d8); Output D(a8)$^A$/Write d8$^A$ into SRAM; Output Da10/Write d8$^B$ into SRAM; Read Da10; Read Da12; Output Da12/Write d9 into SRAM; Read Da14; Output Da14/Write d11 into SRAM)

FIG. 6C

Sequence of Operations

| | n | n+1 | n+2 | n+3 | n+4 | n+5 | n+6 | |
|---|---|---|---|---|---|---|---|---|
| Operation | W | W | W | R | R | W | R | |
| Address* | $a_1$ | $a_2$ | $a_3$ | $a_x$ | $a_y$ | $a_4$ | $a_z$ | |
| Data I/O* | | | $d_1$ | $d_2$ | $d_3$ | | $d_4$ | |
| A1 | | $a_1$ | $a_2$ | $a_3$ | $a_x$ | $a_y$ | $a_4$ | $a_z$ |
| A2 | | | $a_1$ | $a_2$ | $a_3$ | $a_3$ | $a_3$ | $a_4$ |
| A3 | | | | $a_1$ | $a_2$ | $a_2$ | $a_2$ | $a_3$ |
| D1 | | | | $d_1$ | $d_2$ | $d_3$ | $d_3$ | $d_3$ |
| D2 | | | | | $d_1$ | $d_2$ | $d_2$ | $d_2$ |
| ($\overline{W1}$) R1 | | | H | H | H | L | L | H | L |
| ($\overline{W2}$) R2 | | | | H | H | H | L | L | H |

FIG. 8A (Cycle n+4)
($a_x = a_3 \neq a_2$ ; EQ3 = H, EQ4 = L)

| RBW1 | DBW1 | C2 | C3(A) | C3(B) | C4 | Result |
|---|---|---|---|---|---|---|
| H | H | L | L | L | H | $d_3$ |
| H | L | L | L | L | H | $d_3$ |
| L | H | L | L | L | L | $D(a_3)$ |
| L | L | L | L | L | L | $D(a_3)$ |

FIG. 8B (Cycle n+4)
($a_x = a_2 \neq a_3$ ; EQ3 = L, EQ4 = H)

| RBW1 | DBW1 | C2 | C3(A) | C3(B) | C4 | Result |
|---|---|---|---|---|---|---|
| H | H | L | L | H | L | $d_2$ |
| H | L | L | L | L | L | $D(a_2)$ |
| L | H | L | L | H | L | $d_2$ |
| L | L | L | L | L | L | $D(a_2)$ |

FIG. 8C (Cycle n+4)
($a_x = a_3 = a_2$ ; EQ3 = H, EQ4 = H)

| RBW1 | DBW1 | C2 | C3(A) | C3(B) | C4 | Result |
|---|---|---|---|---|---|---|
| H | H | L | L | H | H | $d_3$ |
| H | L | L | L | L | H | $d_3$ |
| L | H | L | L | H | L | $d_2$ |
| L | L | L | L | L | L | $D(a_2)$ |

FIG. 8D (Cycle n+4)
($a_x \neq a_3 \neq a_2$ ; EQ3 = L, EQ4 = L)

| RBW1 | DBW1 | C2 | C3(A) | C3(B) | C4 | Result |
|---|---|---|---|---|---|---|
| H | H | L | L | L | L | $D(a_x)$ |
| H | L | L | L | L | L | $D(a_x)$ |
| L | H | L | L | L | L | $D(a_x)$ |
| L | L | L | L | L | L | $D(a_x)$ |

FIG. 8E (Cycle n+5)
($a_y = a_3 \neq a_2$ ; EQ3 = H, EQ4 = L)

| RBW1 | DBW1 | C2 | C3(A) | C3(B) | C4 | Result |
|---|---|---|---|---|---|---|
| H | H | L | H | L | L | $d_3$ |
| H | L | L | H | L | L | $d_3$ |
| L | H | L | L | L | L | $D(a_3)$ |
| L | L | L | L | L | L | $D(a_3)$ |

FIG. 8F (Cycle n=6)
($a_y = a_2 \neq a_3$ ; EQ3 = L, EQ4 = H)

| RBW1 | DBW1 | C2 | C3(A) | C3(B) | C4 | Result |
|---|---|---|---|---|---|---|
| H | H | H | L | L | L | $d_2$ |
| H | L | L | L | L | L | $D(a_2)$ |
| L | H | H | L | L | L | $d_2$ |
| L | L | L | L | L | L | $D(a_2)$ |

FIG. 8G (Cycle n=6)
($a_y = a_3 = a_2$ ; EQ3 = H, EQ4 = H)

| RBW1 | DBW1 | C2 | C3(A) | C3(B) | C4 | Result |
|---|---|---|---|---|---|---|
| H | H | L | H | L | L | $d_3$ |
| H | L | L | H | L | L | $d_3$ |
| L | H | H | L | L | L | $d_2$ |
| L | L | L | L | L | L | $D(a_y)$ |

FIG. 8H (Cycle n+6)
($a_y \neq a_3 \neq a_2$ ; EQ3 = L, EQ4 = L)

| RBW1 | DBW1 | C2 | C3(A) | C3(B) | C4 | Result |
|---|---|---|---|---|---|---|
| H | H | L | L | L | L | $D(a_y)$ |
| H | L | L | L | L | L | $D(a_y)$ |
| L | H | L | L | L | L | $D(a_y)$ |
| L | L | L | L | L | L | $D(a_y)$ |

Note: $C2 = \overline{(EQ3 \cdot RBW)} \cdot EQ4 \cdot DBW \cdot W2$
$C3 = (EQ3 \cdot RBW \cdot W2)$ OR $(EQ4 \cdot R2 \cdot DBW)$
$C4 = (EQ3 \cdot R2 \cdot RBW)$

FIG. 8I

SEPARATE BYTE CONTROL ON FULLY SYNCHRONOUS PIPELINED SRAM

CROSS REFERENCE TO RELATED APPLICATION

The following pending application is related to this invention: Ser. No. 08/635,128—Fully Synchronous Pipelined Ram, John R. Mick.

CROSS REFERENCE TO MICROFICHE APPENDIX

Appendix A, which is a part of the present disclosure, is a microfiche appendix consisting of two (2) sheets of microfiche having 116 frames. Microfiche appendix A includes circuit diagrams and chip design diagrams for an embodiment of the invention as implemented on an integrated circuit chip. This and other embodiments are further described below.

BACKGROUND OF THE INVENTION

1. Field of the Invention

The invention relates to memory circuits and, more particularly, to fully synchronous pipelined random access memory circuits with individual byte write capabilities.

2. Background

Synchronous state RAMs (SRAMs) are available for use in high performance systems requiring operation with a fast system clock. Some SRAMs are available which use registers to temporarily store address and control. These SRAMs use a "pipeline" scheme where the address to be accessed is provided during one cycle and, during the next sequential cycle, the data is provided on the data bus. For example, during a read operation, the address from which data is to be read is provided on the nth cycle and the data read from the SRAM is provided on the data bus on the (n+1)th cycle. For write operations, there are SRAMs that provide the address, control and data during the same cycle and there are designs where address and control are provided on the nth cycle and data is provided on the (n+1)th cycle.

The speed of the SRAM is increased by pipelining because the set-up and hold time for a register or latch is typically much shorter than the time to access the main array of the SRAM (the difference typically being several nanoseconds). The result is to break the operations into shorter cycles. On the (n+1)th cycle, the register or latch provides the stored address to the SRAMs main array along with the data to be written to the stored address, meeting the set-up and hold times for writing to the SRAM's main array. The SRAM's cycle time as viewed at the pins of the device can be significantly reduced because of the reduced set-up and hold time for the address and data on the (n+1)th cycle. As a result, the frequency of the system clock can be increased.

One problem with conventional SRAMs is that, typically, trying to intermix reads and writes in a high speed system causes a cycle to be "lost" when a memory write is immediately followed by a memory read (i.e., bus turnaround). Generally, a cycle is lost on turnaround because the structure of these RAMs requires an extra cycle to make sure that all of the data is written into the memory before a read operation can be performed. For example, if a write operation is followed by a read operation from the same address, a lost cycle is needed so that the "new" data will be written to the specified address before the read operation is performed on the data stored at the same address. In systems where bus turnaround occurs frequently, the lost cycles on bus turnaround can significantly reduce the bandwidth of the system. With conventional synchronous SRAMs, the same problem can exist.

The invention disclosed in applicant's prior application, Ser. No. 08/635,128, is a fully synchronous Pipelined RAM with no lost cycles on bus turnaround (i.e., the RAM is capable of performing a read operation during any clock cycle or a write operation during any clock cycle, without limitation). The application disclosed both a "single pipelined" SRAM and a "double pipeline" SRAM. The single-pipelined SRAM includes a memory, an input circuit and a logic circuit. The input circuit is coupled to receive a memory address and control signals during any cycle (referred to as the nth cycle). During a write operation on the nth cycle, the corresponding write data to be written into the SRAM is provided during the next, (n+1)th, cycle. During the nth cycle, the logic circuit causes the previously stored write data to be written from the input circuit into the memory while the new write data is received into the input circuit on the (n+1)th cycle. The write data remains in the logic circuit on any intervening read cycle.

On a read operation, the logic circuit compares the address of the read operation to the address of the most recent write operation. If the addresses match, then the SRAM outputs the data stored in the input circuit; however, if the addresses do not match, the SRAM outputs the data stored in the memory corresponding to the requested read address.

In double pipelined operation, the input circuit is coupled to receive a memory address and control signals during any cycle (the nth cycle) and receives data to be written into the SRAM on the (n+2)nd cycle or outputs data from a read operation on the (n+2)nd cycle. Again, if the address of a read request matches one of the stored write addresses, the corresponding data is outputted through the logic circuit on the (n+2)nd clock cycle.

These devices, however, write whole words of data into memory and are not capable of replacing individual bytes of a word separately.

SUMMARY

According to the present invention, the features included in co-pending Application Ser. No. 08/635,128, incorporated here in its entirety, are supplemented with the ability to write selected bytes as well as the entire word to the SRAM. In addition, features also include reading the entire word from the SRAM or from any combination of logic circuitry and memory array storage, as needed, to output the whole word requested by a read operation.

Embodiments of the present invention utilize all bus cycles by internally double pipelining all transactions. The preferred embodiment allows for operation in either single or double pipeline operational mode with the most efficient mode and fastest operation achieved through double pipeline delays. Alternative embodiments of the invention include operation in only double or single pipeline modes.

The user of a device embodying the invention sees a predictable delay (one cycle for single pipeline operation and two cycles for double pipeline operation) for all transactions. There is no requirement placed on what piece of data may be accessed. The device is capable of reading from a combination of the logic circuit and the memory array in order to output the entire word of information requested on a read. The device processes individual bytes of the word.

The operation of these embodiments will be more completely explained below with the Figures and accompanying discussion.

DESCRIPTION OF THE FIGURES

FIGS. 3A and 3B show a timing chart for operation of the single-pipeline embodiment using a representative sample of read and write operations.

FIGS. 6A, 6B and 6C show a timing chart for operation of the double pipeline embodiment using a representative sample of read and write operations.

FIGS. 8A through 8I show truth tables for the selection logic circuit in several scenarios.

DETAILED DESCRIPTION

Single Pipeline Device

Figure 1:
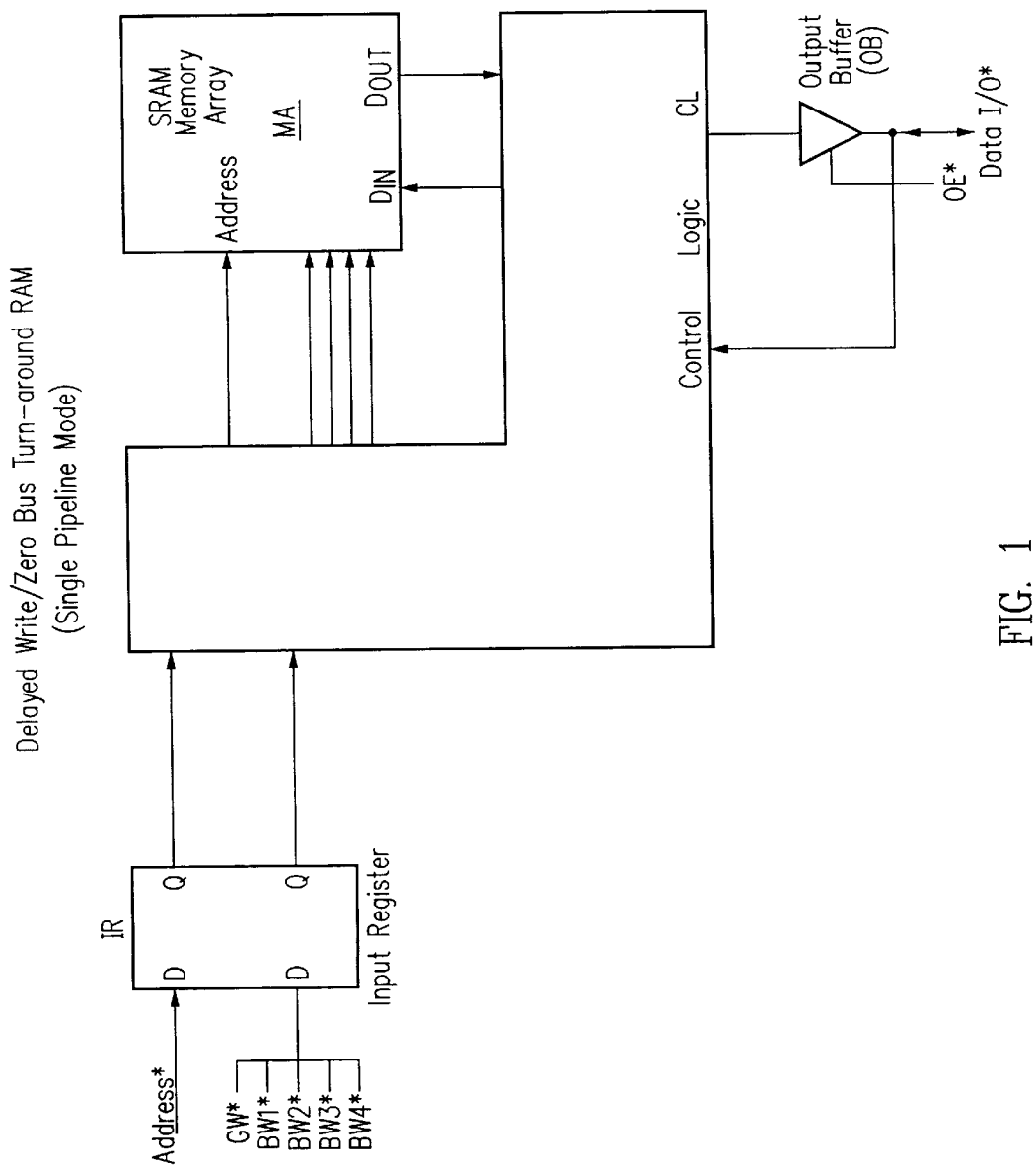
FIG. 1 shows a block diagram of a single pipeline embodiment of the invention.

FIG. 1 shows a simplified block diagram of a single pipeline embodiment of the invention. The embodiment includes a memory array MA, a control logic CL, an input register IR and an output buffer OB. Although this embodiment, and other example embodiments, use SRAM memory cells for memory array MA, DRAM cells may also be used. Memory array MA is capable of receiving and storing data in byte-wise fashion at addresses and of retrieving that data on request.

An address and control signals are recorded into register IR on a rising edge of a clock cycle after an input request is presented. The clock cycle refers to a period of time beginning on the rising edge of a clock signal and ending just prior to the next rising edge of the clock signal. The control signals include a general word write control signal GW* as well as individual byte write control signals BW1*, BW2*, BW3* and BW4*. For discussion, the request is assumed to be presented to the device during an arbitrary nth cycle.

If a write control signal is presented during the nth cycle, the data to be written into the address presented during the nth cycle is presented at DATA I/O* during the (n+1)th cycle. Control logic CL, after receiving both the address to be written and the data to be written, writes the data into a memory array. Control logic CL has the ability to store the write request and the associated data in the event that a read is requested.

If a read control signal is presented to the device, it is clocked into input register IR on the rising edge of the clock signal at the beginning of the nth cycle. During the (n+1)st cycle, the address is compared to any address stored in control logic CL and, if they match, the data stored in control logic CL is output to bus DATA I/O*. If the data stored in control logic CL is not to be completely written into memory array MA (i.e., only certain bytes are written), then the bytes missing from control logic CL are read from SRAM and output to DATA I/O*. During the read operation, any preceding write operation is suspended and stored by control logic CL.

Figure 2A:
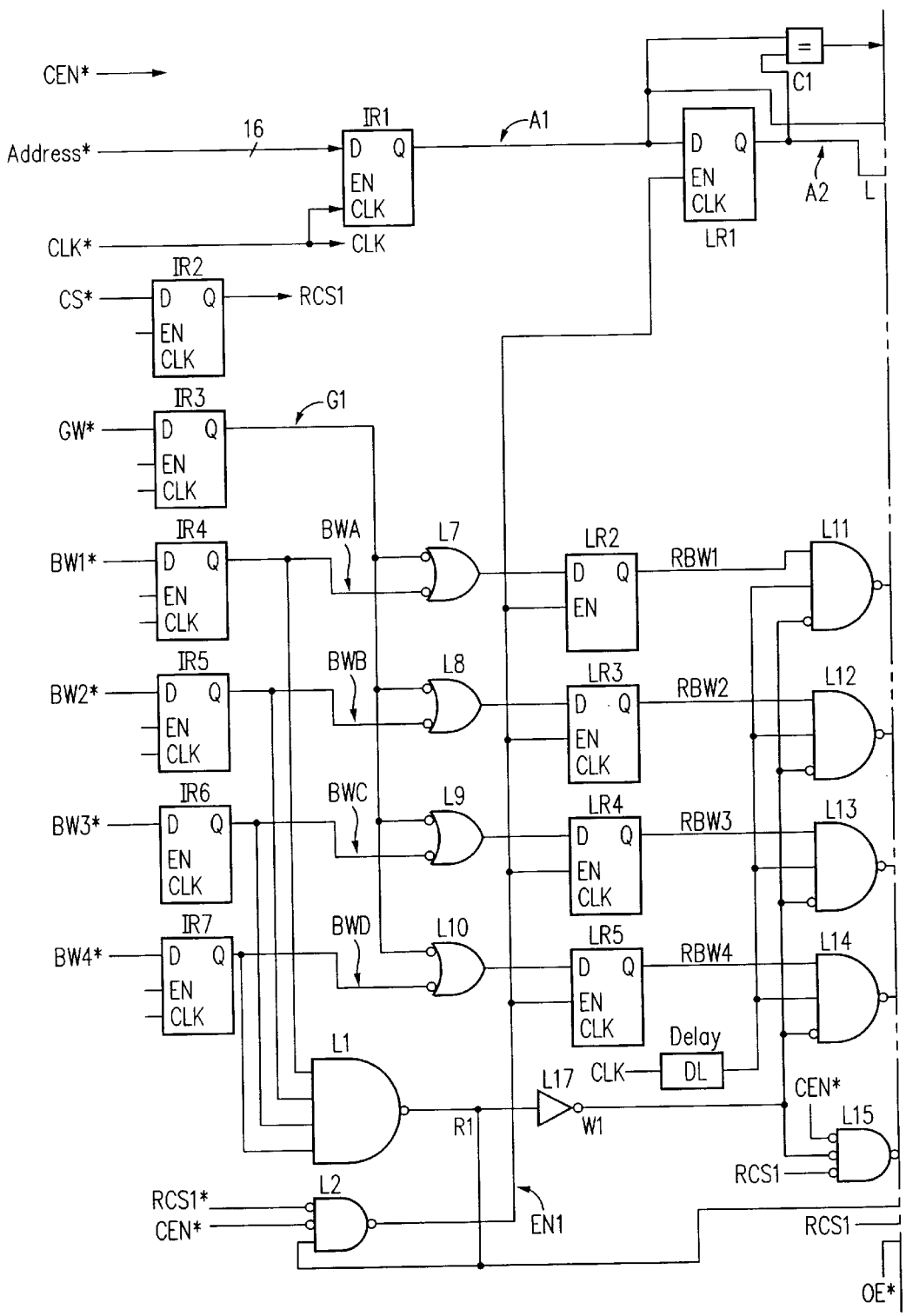
FIGS. 2A and 2B show a circuit diagram for single pipeline embodiment of the invention.
Figure 2B:
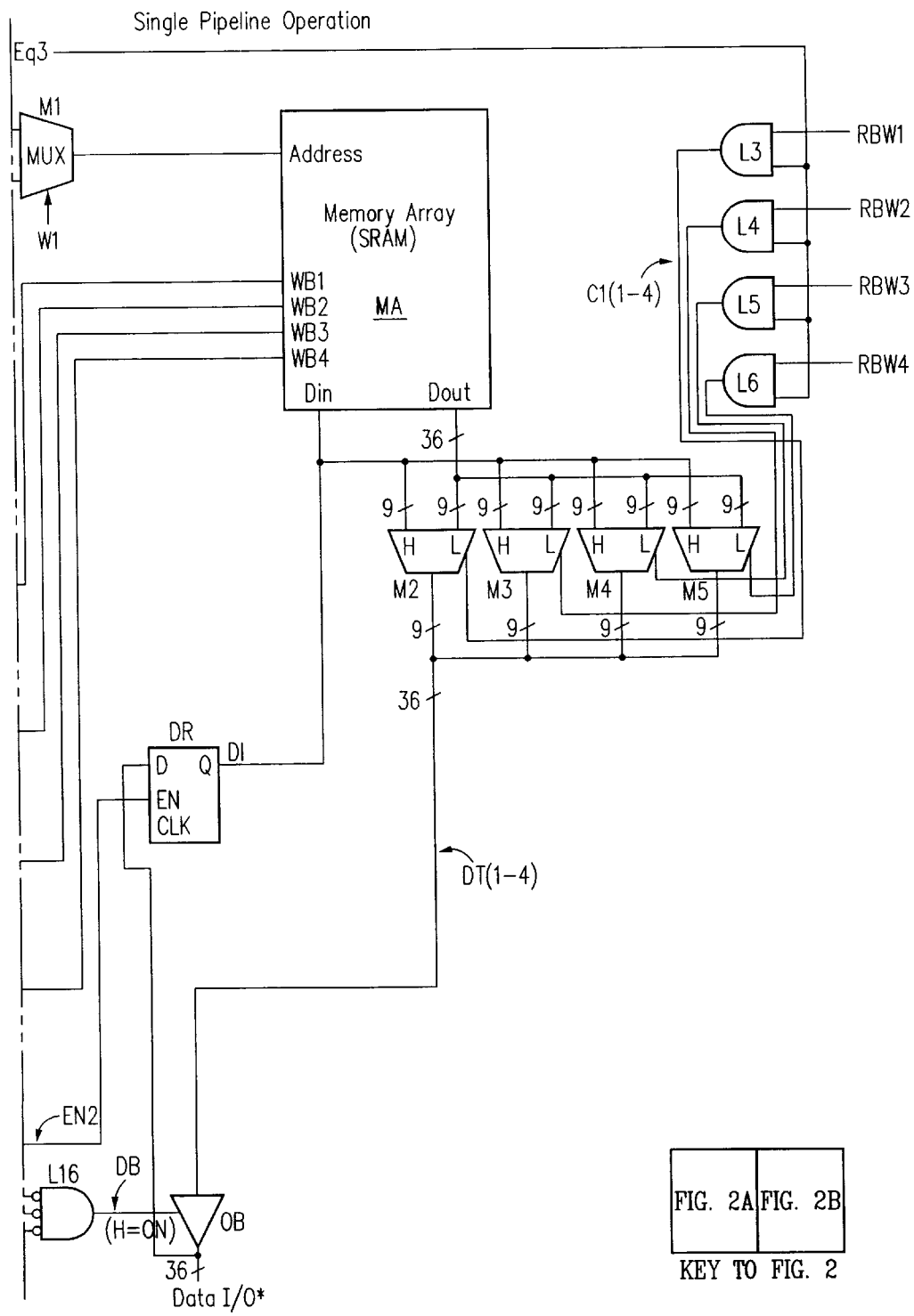

FIGS. 2A and 2B show a circuit diagram for a single pipeline embodiment of the invention. In this embodiment, a data word comprises four bytes. The data word may be of any size with typical data word sizes being 16, 32 or 64 bits. In addition, the size of the individual bytes may be any number of bits up to the size of the data word and each byte may have a different size. Typical sizes of the bytes are 4, 8 or 16. Although the device shown in FIGS. 2A and 2B has a data word comprising four bytes, the embodiments may include any number of bytes of any size that comprise the entire word.

Input signals to the device shown in FIGS. 2A and 2B include a clock enable CEN*, a chip select CS*, address Address*, a clock signal CLK*, a general write GW*, a first byte write BW1*, a second byte write BW2*, a third byte write BW3*, a fourth byte write BW4*, an output enable OE*, and a data presented on a bus DATA used for receiving input data to the chip as well as outputting data from the chip. Clock enable CEN* and chip select CS* must be low to allow data to enter the device. A low signal for GW*, BW1*, BW2*, BW3* or BW4* indicates a write request. If general write GW* is low a whole word (all bytes) write is requested. If signals BW1*, BW2*, BW3* and BW4* are all high, however, a read is requested regardless of the state of signal GW*. The operation of these control signals will be further explained below.

The address input line is connected to an input register IR1. Similarly, input registers IR3, IR4, IR5, IR6, and IR7 are connected to receive signals GW*, BW1*, BW2*, BW3* and BW4*, respectively. Chip select CS* is presented to input register IR2. All registers in the device latch the signals at their input line on the rising edge of the clock signal. In addition, each register includes an enable input lead which allows the register to record new data only if an enable signal on the enable input lead is low (L). Input registers IR1–7 (indicating IR1, IR2, IR3, IR4, IR5, IR6 and IR7) are all enabled by clock enable CEN* being presented to the enable input lead of input registers IR1–7.

The address* and control signals GW* and BW1–4* are presented during a clock cycle and clocked into the input registers IR1–7 upon the rising edge of the clock signal at the onset of the next cycle. For convenience, the clock cycle within which control signals are presented to the chip will be labeled arbitrarily the nth cycle. During the (n+1)th cycle, the address and control signals have been recorded by input registers IR1–7.

The output lead of input register IR1 is attached to the input line of logic register LR1. The output signal from input register IR2 is RCS1. The output lines of input registers IR4, IR5, IR6, and IR7, carrying signals BWA, BWB, BWC and BWD (BWA–D) respectively, are connected to NAND gate L1. Output signal R1 from gate L1 is low except where signals BWA–D are all high, indicating a read operation.

The output signal R1 from NAND gate L1 is presented to gate L2 which outputs the signal EN1. Signal EN1 is low if signal R1 is high, signal RCS1 is low, and signal CEN* is low. Therefore, in any operation not a read where the chip is enabled and selected, signal EN1 is low. Signal EN1 is inputted to the enable input lines of logic registers (LR1–5). If the operation stored in input registers IR1–7 is a read operation, that operation is not recorded on the next clock cycle ((n+2)nd) by logic registers LR1–5. If not enabled, logic registers LR1–5 retain the signals that they had previously recorded.

The output signal from input register IR3, G1, is presented to gate L7 along with signal BWA. The output signal from OR gate L7 is high if either of signals G1 or BWA is low, indicating that either Byte 1 is to be written or the general word control signal, GW*, is calling for an all word write. Similarly, signal GW* is presented to OR gates L8, L9 and L10 along with a corresponding one of signals BWB, BWC, and BWD so that the output signals from gates LR8–10, are all high (H) if either a general word write is requested or a write to that corresponding byte of the data word is requested. The output lines of gates L7–10 are connected to a corresponding input line of logic registers LR2–5.

Signal W1 along with signals RCS1 and CEN* are presented to gate L15. The output signal from gate L15, EN2, is low if signal RCS1 is low, signal W1 is low, and signal CEN* is low, indicating that the operation recorded in input registers IR1–7 is a write operation. At the start of the (n+1)st cycle, a data register DR records data which is presented on bus DATA I/O* if signal EN2 is low. The output signal from register DR, data D1, is inputted to a data input line Din of memory array MA.

Also, at the leading rise of the clock signal indicating the start of the (n+1)st cycle, and providing that signal EN1 is low, logic registers LR1–5 record the signals at their input leads. The output lead of logic register LR1, carrying address A2, is connected to the low-input lead of multiplexer M1. The high-input lead of multiplexer M1 is connected to the output lead of register IR1 to receive address A1. The output lead of multiplexer M1 is connected to the address input lead of memory array MA.

Signal R1 is inputted to NOT gate L17 so that the output signal from gate L17, W1, is low if signal R1 is high (indicating not a read request). Signal W1 is inputted through an input select line to multiplexer M1 so that if the operation stored in input registers IR1–7 is a write, address A2 is presented to the address input of memory array MA. Conversely, if the operation stored in registers IR1–7 is a read, address A1 is presented directly to the address input line of memory array MA.

The output signals from logic registers LR2–5, RBW1–4, are presented to logic gates L11–14, respectively, along with signal W1 and a delayed clock signal. The output of gates L11, L12, L13 or L14 will go low during the (n+1)st clock cycle only if signal W1 is low (indicating not a read) and the corresponding one of signals RBW1–4 is high (indicating a write for that respective byte). The output signal from each of L11–L14 will go low, if at all, during a high clock signal which is delayed by some time from the system clock by a delay circuit DL. The delay time created by delay circuit DL is sufficient to compensate for set-up and hold times in the circuit. Output signals from gates L11–14 are presented to lines WB1–4, respectively, of memory array MA. Memory array MA writes the respective bytes of data presented at line Din to the address presented on its address input when the corresponding signal on lines WB1–4 becomes low.

Addresses A1 and A2 are presented to a comparator C1 whose output signal EQ3 is high if addresses A1 and A2 are equal. Signal EQ3 is presented to each of AND gates L3–6 along with a corresponding one of signals RBW1–4. The output signals from gates L3–6, C1(1–4), respectively, are presented to select input lines of multiplexers M2–5, respectively. The low-input sides of multiplexers M2–5 are connected to the corresponding byte output lines of line Dout of memory array MA. The high input lines of multiplexers M2–5 are connected to the receive corresponding bytes of data D1.

The output signals from multiplexers M2–5, DT(1–4), are inputted to an output buffer OB. Output buffer OB may be a tristate buffer. In addition, output buffer OB may be capable of assuming a high impedance or a low impedance. Output buffer OB allows throughput only when enabled.

Output enable OE*, along with signals R1 and RCS1, are presented to gate L16 such that the output signal from gate L16, DB, is high if signal OE* is low, signal RCS1 is low (the chip is selected), and signal R1 is low (indicating a read operation). Output buffer OB is enabled, allowing the output signals from multiplexers M2–5, DT(1–4), to be presented to data bus DATA I/O* if DB is high.

Single Pipeline Operation

FIGS. 3A and 3B illustrate a timing chart for operation of the single pipelined chip embodiment shown in FIGS. 2A and 2B. The chart starts at an arbitrary clock cycle designated as the nth cycle and continues through several clock cycles. The requested operation sequence includes several read and write requests and was chosen for its demonstrative value. The circuit itself is capable of processing any number of requests in any sequence. Unless stated otherwise, address $a_i$ does not equal address $a_j$ where i is not j.

A write operation is initiated by presenting the chip with an address as Address*, enabling the clock by setting CEN* to low, selecting the chip by setting CS* to low, and supplying the appropriate control signals. Setting signal GW* to low while not having all of signals BW1*, BW2*, BW3* and BW4* high will result in an all word write. Setting signal GW* to high will result in a selective write of the bytes corresponding to whichever of signals BW1–4* is low. Setting signals BW1–4* all high results in a read operation.

nth cycle—write initiated

In FIGS. 3A and 3B, the first write operation is initiated during clock cycle n by presenting the chip with Address*= a0, GW*=L, and BW1–4*=(L, L, L, L)(i.e., BW1*=L, BW2*=L, BW3*=L and BW4*=L).

(n+1)st cycle—write initiated

At the rising edge of the clock signal indicating the start of clock cycle n+1, input registers IR1–7 record the signals Address*, CS*, GW*, BW1*, BW2*, BW3* and BW4*. Therefore, signals A1=ao, G1=L, and BWA–D=(L, L, L, L).

During the (n+1)st cycle, signal R1 is high indicating a write, signal W1 is low, and signals EN1 and EN2 are low enabling both data register DR and logic registers LR1–5. The output signals from gates L7–8 all become high because signal G1 is low and signals BWA–D are all low. The data, d0, to be written into address a0 must be presented to the chip on bus DATA I/O* during this cycle. Output buffer OB is not enabled so long as output enable OE* is high.

In addition, the chip is presented with a write to address a1 with control signals set to GW*=L and BW1–4*=(H, H, L, L).

(n+2)nd cycle—write initiated

At the start of the (n+2)nd cycle, address a0 is shifted from input register IR1 to logic register L1 so that address A2 becomes a0. The data do is recorded in data register DR and presented to input line Din of memory array MA. The high output signals from gates L7–10 are recorded in registers LR2–5, and therefore signals RBW1–4 are all high. The write requested during the (n+1)st cycle is recorded in input registers IR1–7. As a result, signal R1 is high because not all of signals BWA–D are high and signal W1 remains low. Enable signals EN1 and EN2 both remain low. In addition, gates L11–L14 each output a low signal when the delayed clock signal goes high because signals RBW1–4 are high and signal W1 is low. Multiplexer M1 presents the output address from LR1, A2 (in this case address a0), to address input line of memory array MA because signal W1 is low. Therefore, data do is written into memory location a0 of memory array MA.

The output signals from gates L7–10 are all high because signal G1 is low. Therefore, even if signals BWA and BWB are high (signals BWC and BWD are both low), the output signal from each of gates L7–10 is high.

In addition, data d1, the data to be written into address a1, must be presented to bus DATA I/O* during this cycle. A new write request is initiated during this cycle by presenting the address input with address*=a2 and the control inputs with GW*=H and BW1–4*=(L, L, L, L)

(n+3)rd cycle—Write initiated

At the start of the (n+3)rd cycle, the write request presented during the (n+2)nd cycle is recorded in input registers IR1–7, the data presented on bus DATA I/O* is recorded in data register DR and data d1 is presented to the Din input line of memory array MA. At the inception of the (n+3)rd cycle, the address recorded in input register IR1 is shifted to logic register LR1 and A2 becomes a1. The high output signals from gates L7–10 are recorded in logic registers LR2–5, respectively, and therefore signals RBW1–4 all become high.

During the (n+3)rd cycle, signal R1 is high because signals BWA–D are not all high. Therefore, signal W1 is low and enable signals EN1 and EN2 are each low. The output signals from gates L11–14 will all go low during the cycle when the delayed clock cycle goes high because signal W1 is low. The output signals from gates L7–10 are all high because signals BWA–D are all low, even though signal G1 is high. Address A2 (a1), is presented to memory array MA through multiplexer M1 because signal W1 is low. Therefore, memory array MA writes all bytes of data d1 into address a1 during this cycle.

Also during this cycle, a write operation Address*=a3, Gw*=H and BW1–4*=(H, H, L, L) is initiated. The data to be written into address a2, data d2, must also be presented on bus DATA I/O* during this cycle. (n+4)th cycle Read initiated At the start of the (n+4)th cycle, address A1 (a2) is shifted to logic register LR1 and logic registers LR2–5 record the output signals from gates L7–10 (all high in this case). The data d2, is recorded into data register DR and presented to memory array MA on the Din input. Input registers IR1–7 also record the signals at their input lines.

Signal R1 is high and signal W1 is low because not all of signals DBA–B are high. Enable signals EN1 and EN2 are therefore both low. Address A2 (a2) is presented to memory array MA through multiplexer M1 because signal W1 is low. In addition, the output signals from gates L11–14 will all go low when the delayed clock signal goes high because signal W1 and signals RBW1–4 are all high. Therefore, memory array MA writes data d2 into address a2.

Logic gates L7 and L8 are low because signals G1, BWA and BWB are all high. Signals BWC and BWD are each low, however, causing gates L9 and L10 to each output a high signal.

In addition, a read request is initiated during this cycle by setting Address*=a4 and setting the control signals to GW*=L and BW1–4*=(H, H, H, H). The data d3 to be written into address a3 must be presented to bus DATA I/O* during this cycle.

(n+5)th cycle—Read initiated

At the start of the (n+5)th cycle, address A1 (a3) is shifted to logic register LR1 and data d3 is recorded in data register DR and presented to the SRAM through line Din. Logic register LR2–5 record the output signals from gates L7–10, (L, L, H, H). The read request is recorded in input registers IR1–7.

Signal R1 is low and signal W1 is high because signals BWA–D are all high, consistent with a read request. Enable signals EN1 and EN2 both become high, thereby disabling logic registers LR1–5 and Data register DR for the next cycle. Address A1 (a4), is presented to memory array MA through multiplexer M1 and the output signals from gates L11–14 remain high because signal W1 is high. Therefore, memory array MA performs no write on this cycle and the read address a4 is presented to the address input of memory array MA.

Comparator circuit, C1, outputs a low signal because address A1 (a4), does not equal address A2 (a3). As a result, logic gates L3–6 all output low signals. Therefore, the data in address a4 of memory array MA is presented at line Dout of memory array MA and passed through multiplexers M2–5 to output buffer OB. Output enable OE* must be set to low during this cycle so that the output signal from gate L16, DB, is high and output buffer OB is enabled. The data, Da4, from memory array MA is outputted to bus DATA I/O*. No input data can be presented to bus DATA I/O* during this cycle.

A second read is initiated during this cycle with a3 (a previously written address) being presented as address* and the control signals being set to GW*=H and BW1–4*=(H, H, H, H).

(n+6)th cycle (write initiated)

At the start of the (n+6)th cycle, logic registers LR1–5 and data register DR retain the contents that they had during the (n+5)th cycle because enable signals EN1 and EN2 are both high at the time of transition between the (n+5)th and (n+6)th cycles, the rising edge of the clock cycle. The input signals presented to the chip during the (n+5)th cycle are recorded in input registers IR1–7.

Signal R1 is low and signal W1 is high because, again, signals BWA–D are all high indicating a read operation. Therefore, enable signals EN1 and EN2 are both high which again disables logic registers LR1–7 and data register DR for the next cycle. In addition, address A1 (a3), is presented to the address input of memory array MA.

Comparator C1 outputs a high signal because addresses A1 and A2 are both a3. The output signals from gates L3–6, C1(1–4) are (L, L, H, H), respectively, because signals RBW1–4 are (L, L, H, H). Therefore, multiplexers M2 and M3 output the values at their low-input lines while multiplexers M4 and M5 output their the values on their high-input lines. Data DT(1–4), therefore, consists of the first two bytes of data present at line Dout (which is the data in memory location a3 of memory array MA, Da3) and the last two bytes from data D1 (which corresponds to the part of the data word which is to be written into address a3 of memory array MA).

Output enable OE* must be set to low so that the output signal from gate L16, DB, is high causing output buffer OB to output data DT(1–4) to bus DATA I/O*. During this cycle, a write is initiated by setting Address*=a5 and the control signals to GW*=L and BW1–4*=(L, L, L, L).

(n+7)th cycle—write initiated

At the start of the (n+7)th cycle, both enable signals EN1 and EN2 are high at the start of the cycle and therefore logic registers LR1–5 and data register DR are disabled. The input signals presented during the (n+6)th cycle are recorded in input registers IR1–7. Signal R1 is high and signal W1 is low because signals BWA–B are all low. Therefore, signals EN1 and EN2 are both low and address A1 (a3), is presented to the address input of memory array MA through multiplexer M1. Data D1 (d3), is presented to the data input Din line of memory array MA. The output signals from gates L13 and L14 will go low when the delayed clock signal goes high because signals RBW3 and RBW4 are high. The output signals from gates L11 and L12 remain high because signals RBW1 and RBW2 are low. Therefore, the third and fourth bytes of data d3 stored in data register DR are written into memory array MA at address a3 while the first two bytes of the data word at address a3 remain untouched.

During the (n+8)th cycle, logic registers LR1–5 and data register DR are enabled so that they once again process data as described in the (n+2)nd through (n+4)th cycles. The remaining cycles described in FIG. 3 are similar to previously described cycles and will not be discussed.

Double Pipeline Device

Figure 4:
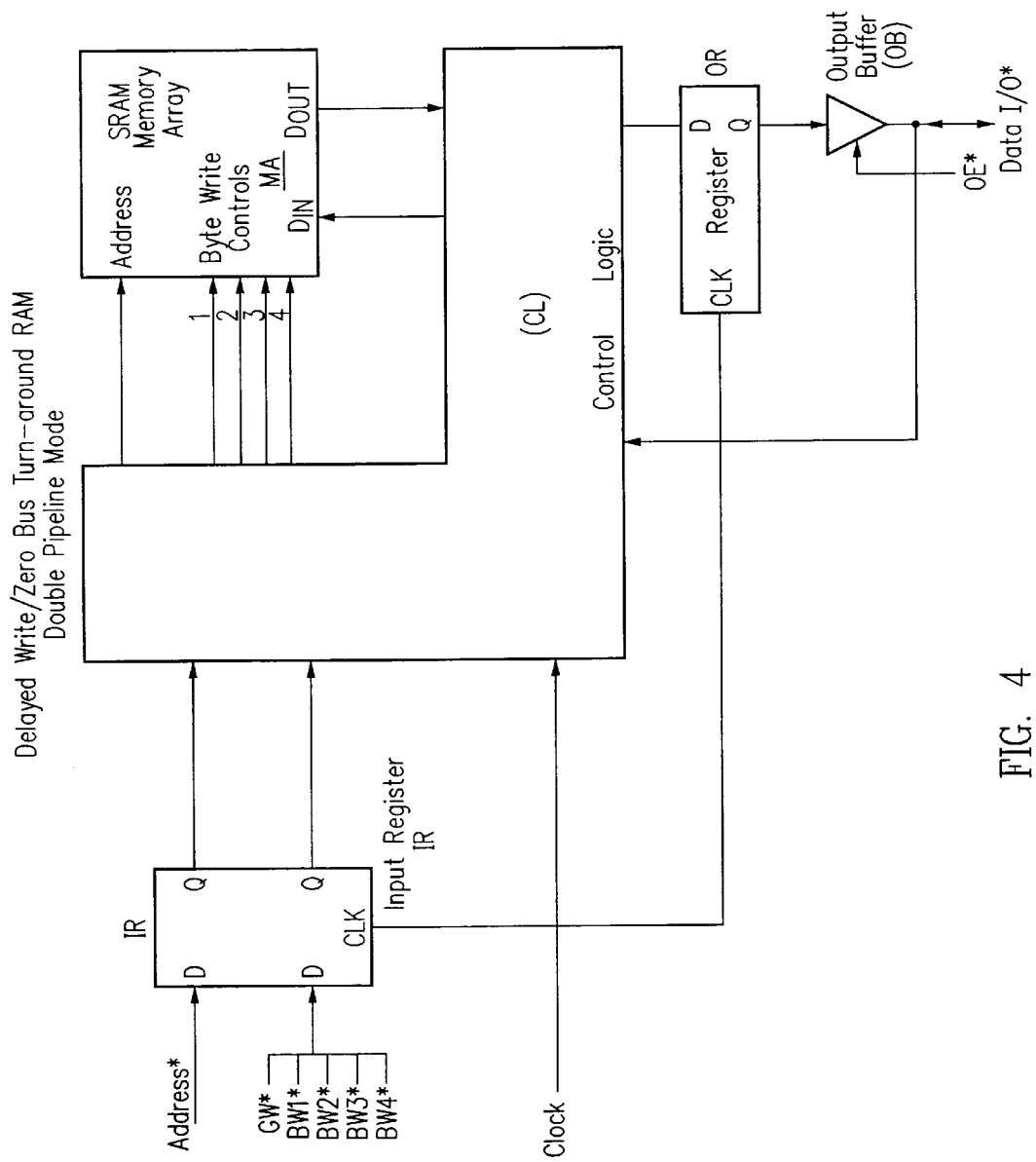
FIG. 4 shows a block diagram of a double pipeline embodiment of the invention.

FIG. 4 shows a block diagram of a double pipeline embodiment of the invention. At the rising edge of the clock signal corresponding to the beginning of the nth clock cycle (chosen arbitrarily), address and control signals are recorded by input register IR. The control inputs include a general write GW* and individual byte write signals BW1*, BW2*, BW3*, and BW4*. If signal GW* is low and at least one of signals BW1–4* is low, a whole word write is requested. If signal GW* is high and at least one of signals BW1–4* is low then a write is requested for whichever of the individual byte write signals is low. If the individual byte write signals are all high, then a read is requested.

A control logic CL determines which operation stored on input register IR is being requested, and processes that operation. If a write operation is being requested, then the contents of input register IR are recorded in control logic CL at the start of the (n+1)st clock cycle. The data to be written is presented to a bus DATA I/O* on the (n+2)nd cycle. At some later cycle, the address, data, and individual byte write signals are presented together to memory array MA by control logic CL. The data is presented through the Din input line of memory array MA. As before, memory array MA is capable of receiving and storing, in individual bytes, a data word at a particular address and of retrieving that data upon request. Although preferably an SRAM device, memory array MA could also be a DRAM device.

In a series of write requests, uninterrupted by a read request, control logic CL will have recorded two sets of addresses and commands and the data corresponding to the earlier write request. The earlier request, along with the corresponding data, are presented together to memory array MA and the data corresponding to the later write request is recorded in control logic CL at the beginning of the next clock cycle.

If a read is requested during the nth cycle, it is recorded in input register IR at the beginning of the (n+1)st cycle. Control logic CL detects a read request on the input register and "freezes" the pipelining of requests through control logic CL. The data necessary to complete the currently stored write requests, however, is recorded normally at the (n+1)st clock cycle and then the ability of control logic CL to record new data is suspended for the (n+2)nd clock cycle.

The read request is immediately processed by control logic CL. The address to be read is presented to memory array MA and compared against addresses which are currently stored in control logic CL. If there is no match with stored addresses, then the contents of memory array MA at the read address is presented to an output register OR. If the address to be read is one of the previously stored addresses, then the data that is to be written to memory array MA is presented to output register OR. If the write request corresponding to the matched address calls for less than a whole word write, then the bytes of the data word which are to be written to memory array MA are presented to output register OR and the output data word is filled in with the necessary bytes read from memory array MA stored at that read address.

If the read address matches both stored addresses in control logic CL, then the data corresponding to the latest write request is presented to output register OR if that request is a whole word write. If it is not a whole word write, then the bytes from the latest request is presented to output register OR and the output data word is filled in with bytes to be written by the earlier write request and, if the data word is not yet complete, by the contents of memory array MA stored at that address.

Output register OR records the data word presented to it on the (n+2)nd clock cycle. On that cycle, a output buffer OB connected to output register OR is enabled by setting output enable OE* signal low. The contents of output register OR are then presented to data bus DATA I/O*.

The device of this embodiment can record and process a read or write request on every clock cycle. The data for a write request must be presented to bus DATA I/O* two clock cycles after the write request is made. In addition, a read request will result in bus DATA I/O* being presented with the read data two clock cycles after the read request is made.

Figure 5A:
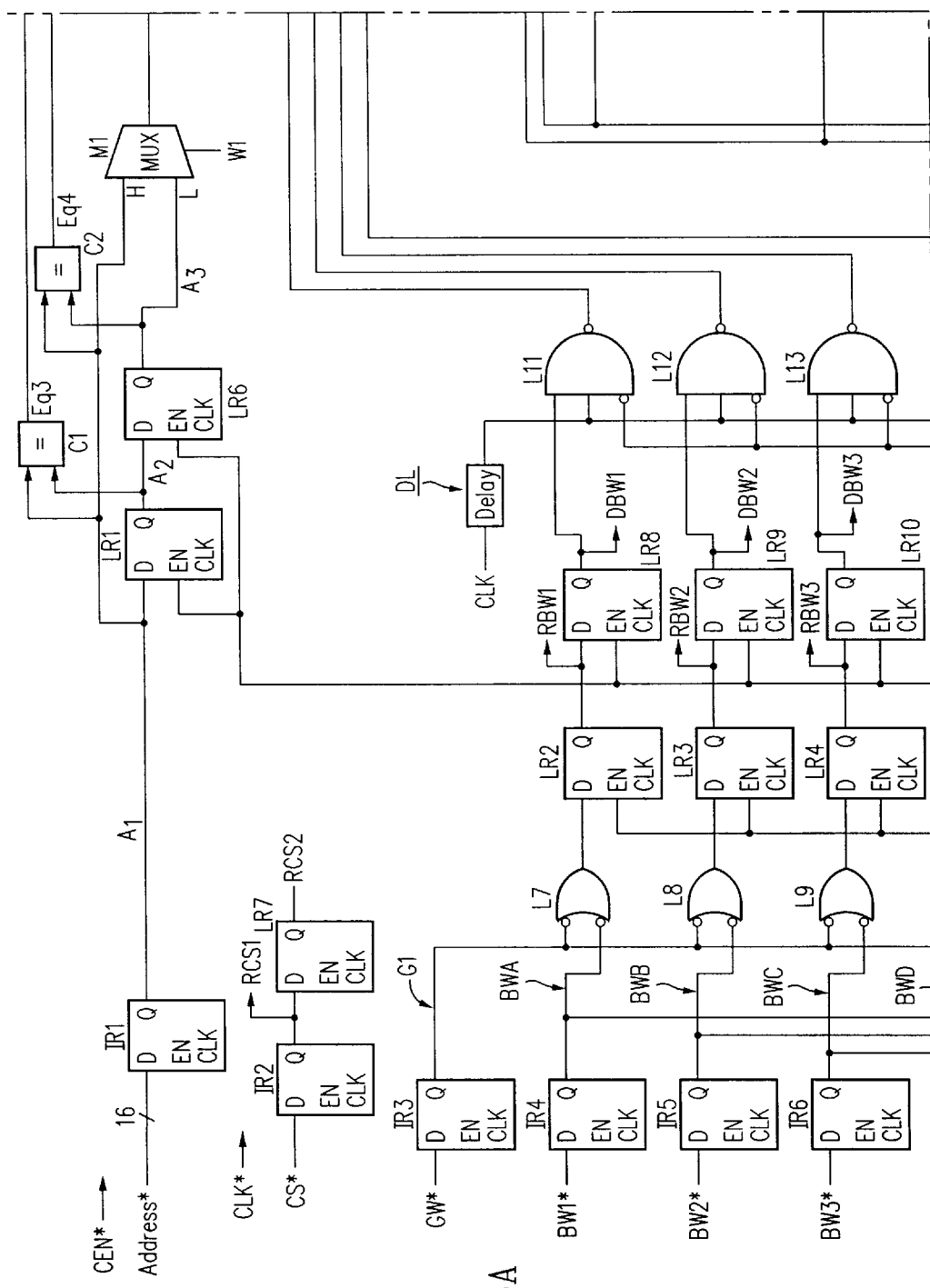
FIGS. 5A, 5B, 5C and 5D show a circuit diagram for a double pipeline embodiment of the invention.
Figure 5B:
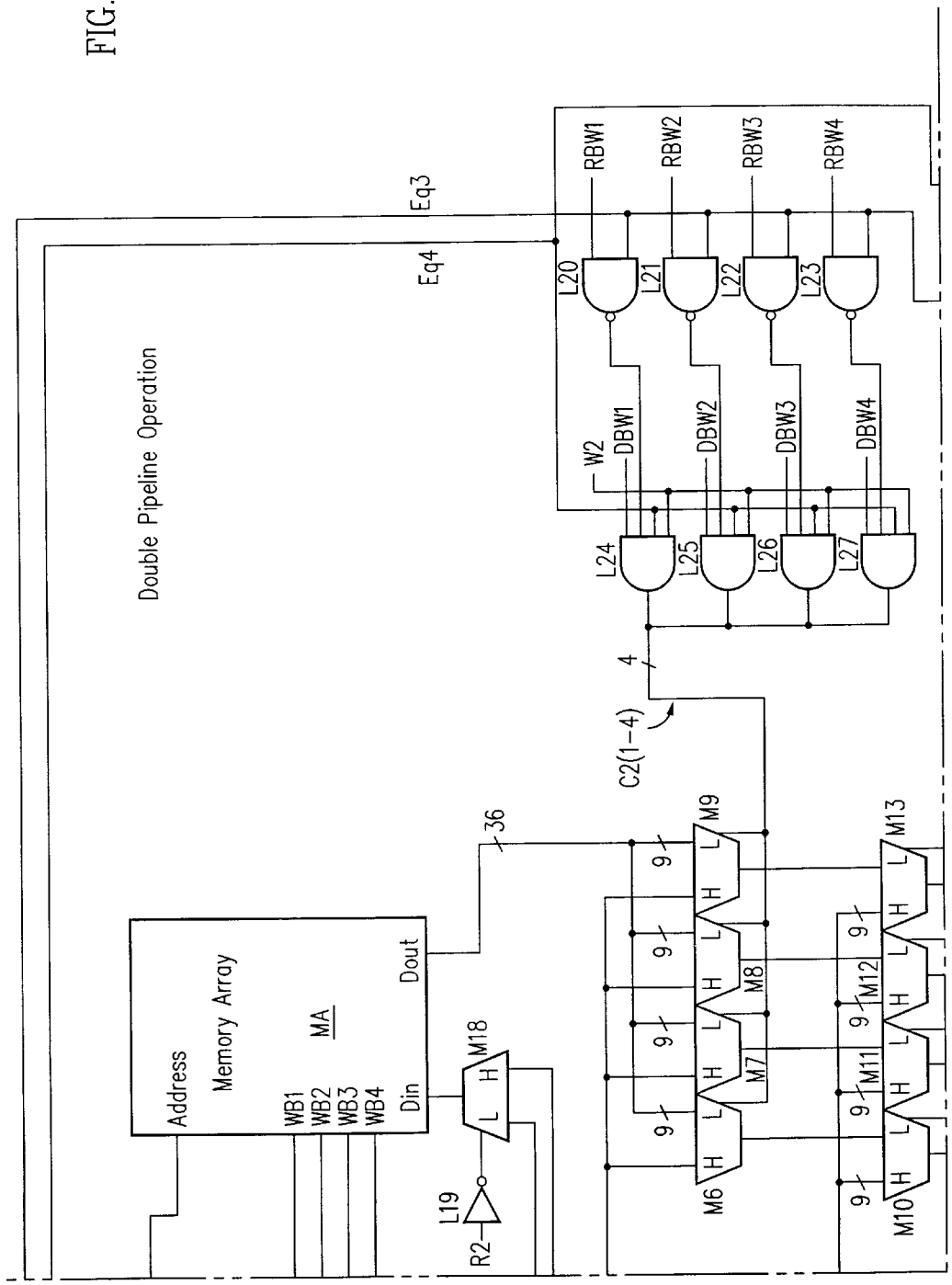
Figure 5C:
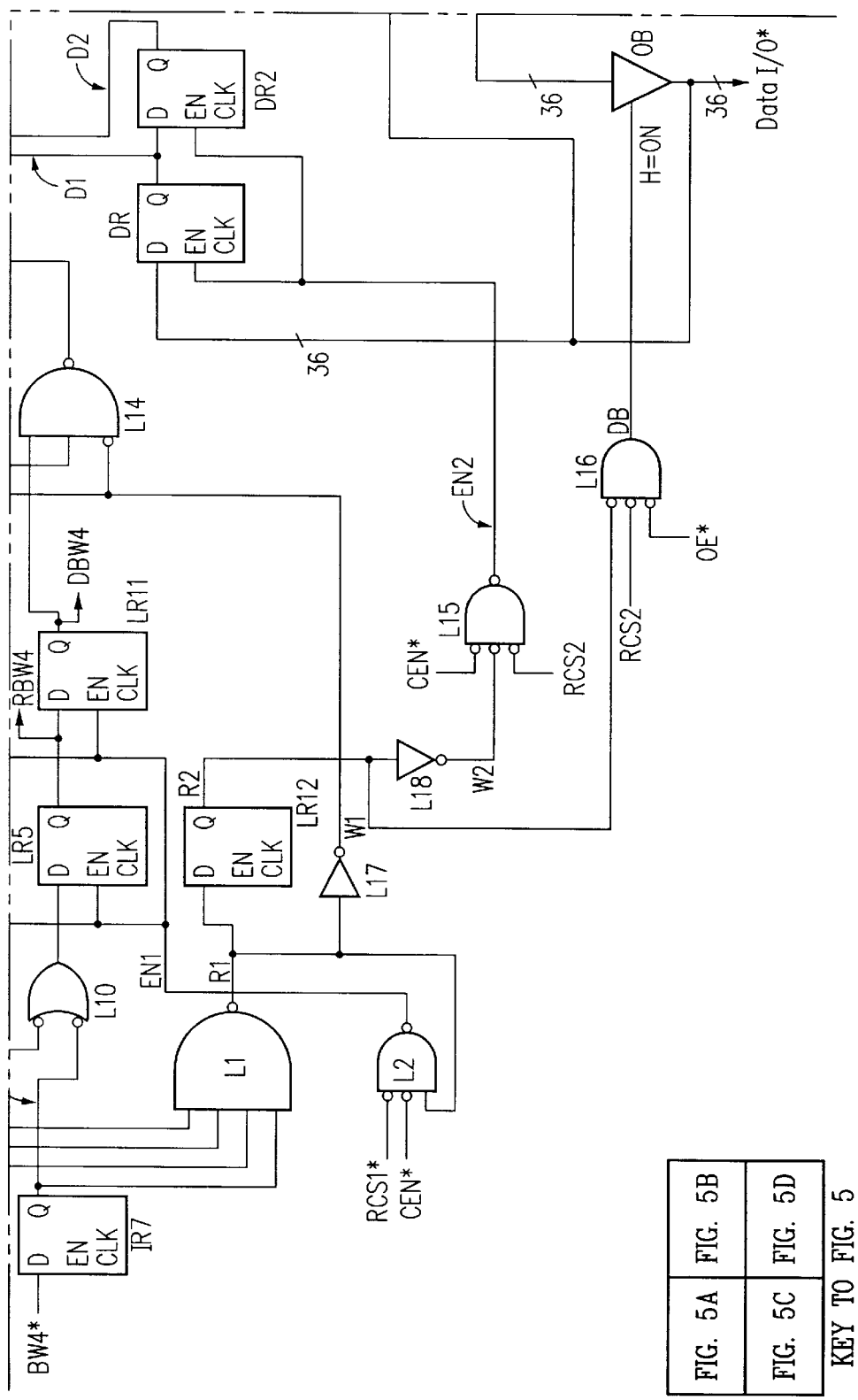
Figure 5D:
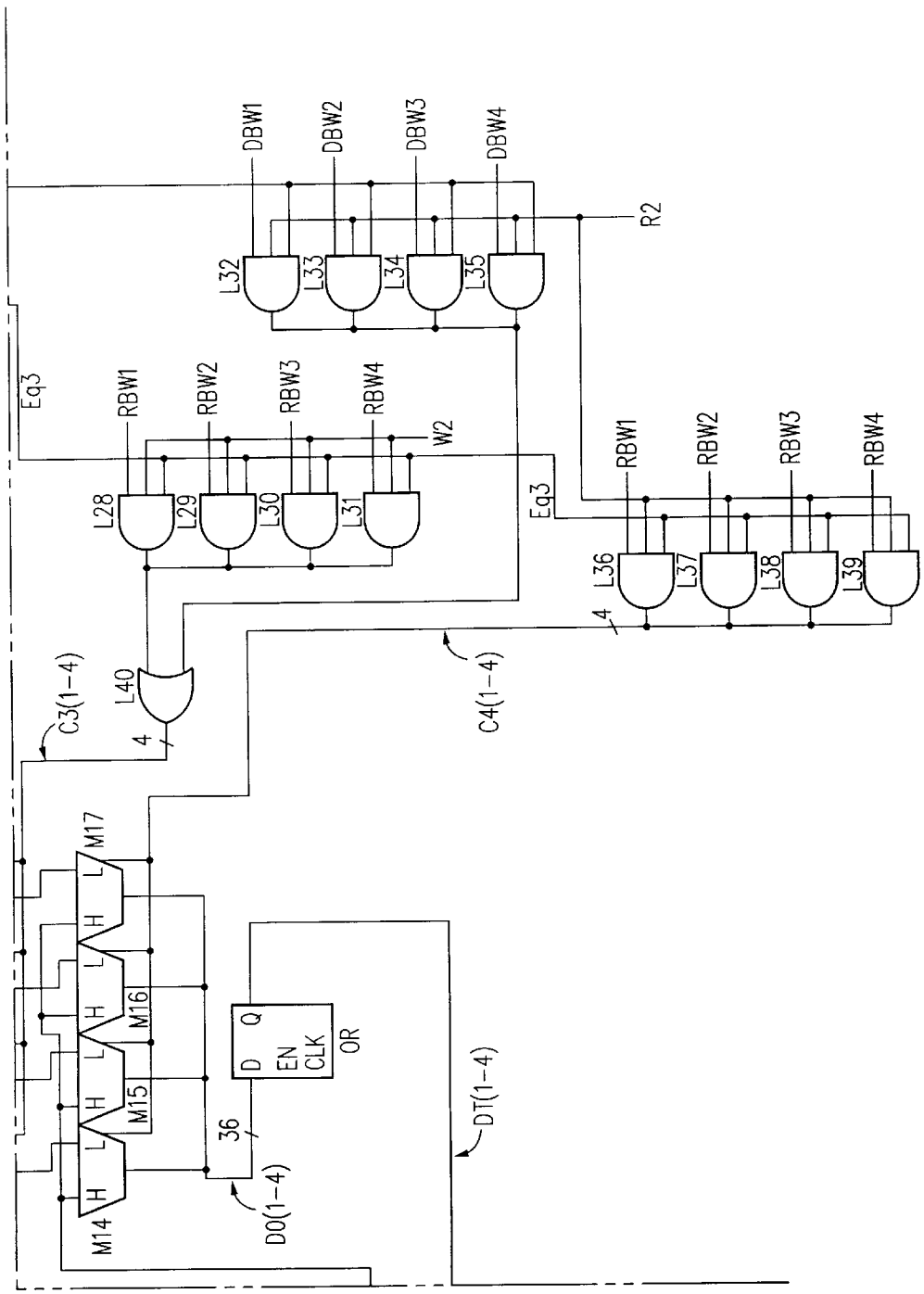

FIGS. 5A and 5B illustrate a circuit diagram for the double pipeline embodiment of this invention shown in block diagram form in FIG. 4. The components are labeled such that components which overlap with the single pipeline embodiment of FIGS. 2A and 2B are identically labeled. The input signals to the circuit described in FIG. 5 are an address Address*, control signals GW*, BW1*, BW2*, BW3* and BW4*, a clock signal CLK*, a clock enable CEN*, a chip select CS*, an output enable OE*, and a bus DATA I/O*.

An address input line is connected to the input side (D) of an input register IR1. Similarly, chip select CS*, general word write GW*, and byte write BW1*, BW2*, BW3* and BW4* are all presented to the input lines of input registers IR2–7, respectively. Input registers IR1–7 each have an enable input line which is connected directly to receive clock enable CEN*. Input registers IR1–7 are also connected to receive clock signal CLK* and record the signal at their inputs on a rising edge of clock signal CLK*, provided that the clock enable CEN* is low. If clock enable CEN* is high, input registers IR1–7 are disabled and do not change their state, retaining the signals which were previously recorded. Address and control signals presented to the chip during arbitrarily chosen clock cycle n will be recorded by input registers IR1–7 on the rising clock signal at the beginning of the (n+1)st cycle.

The output signals from input registers IR4–7—BWA, BWB, BWC and BWD, respectively—are presented to the input of a NAND gate L1. The output signal from gate L1, R1, is low only if signals BWA–D are all high indicating a read operation. Signal R1 is presented to the inputs of logic register LR12, gate L2 and inverter L17. The input signals presented to gate L2 also include the output signal from input register IR2, RCS1, and clock enable CEN*. The output signal from gate L2, EN1, is low if signal R1 is high, clock enable CEN* is low, and signal RCS1 is low. Signal EN1 being low, then, indicates that the clock is enabled, the chip is selected and there is no current read operation. The output signal from inverter L17, W1, is the inverse of signal R1 so that when signal R1 is high, signal W1 is low.

The output signal from input register IR3, G1, is presented to input lines of each of gates L7–10. The input signals to gates L7–10 also include a corresponding one of the output signals from input registers IR4–7, BWA–D, respectively. The output signals from gates L7–10 are each high if either signal G1 is low or the corresponding one of signals BWA–D is low. A high output signal from any of gates L7–10 indicates a write request for that corresponding byte of a data word to address A1 in memory array MA.

The output signals from gates L7–10 are presented to the input lines of logic registers LR2–5 so that the control logic CL records the write operation request at the beginning of the (n+2)nd clock cycle. The enable input of logic registers LR2–5 are connected to receive signal EN1 so that if the request currently stored in input registers IR1–7 is a read request, signal EN1 is high and logic registers LR2–5 are disabled and do not record new information. This effectively freezes the signals from the (n+1) cycle in place for the duration of the (n+2) clock cycle.

Similarly, address A1 is presented to logic register LR1 so that address A1 is advanced into logic register LR1 on the rising edge of the clock cycle starting the (n+2)nd cycle. The enable input line of logic register LR1 is also connected to receive signal EN1 so that address A1 is not advanced if address A1 corresponds to a read operation.

The output signals from logic registers LR2–5, RBW1–4 respectively, are presented to the input lines of logic registers LR8–11. On the start of the (n+2)nd clock cycle, signals DBW1–4 are recorded in logic registers LR8–11. Logic registers LR2–5 each have an enable input which is presented with signal EN1 so that if the operation recorded in input registers IR1–7 is a read operation, logic registers LR8–11 will be disabled and not record new signals.

The output signal from logic registers LR1, A2, is presented to the input line of logic register LR6 so that on the start of the (n+2)nd clock cycle, address A2 is recorded by logic register LR6. Logic register LR6 has an enable input line which is connected to receive signal EN1 so that if the request recorded in input registers IR1–7 is a read operation, logic register LR6 is disabled and will not record new addresses.

The output signal from logic register LR6, A3, is presented to the low-input line of multiplexer M1. The high-input line of multiplexer M1 is connected to receive address A1 from input register IR1. The select input line of the multiplexer is connected to receive signal W1 so that if address A1 corresponds to a read request, signified by signal W1 being high, address A1 is the output address of multiplexer M1. If signal W1 is low, signifying a write request on input registers IR1–7, address A3 is the output address of multiplexer M1. The output address of multiplexer M1 is presented to the address input of memory array MA.

The output signals from logic registers LR8–11 are inputted to gates L11–14, respectively (LR8 to L11, LR9 to L10, etc.). The input lines of each of gates L11–14 are also presented with signal W1 and with a delayed clock signal. A delay circuit inputs clock signal CLK* and outputs a clock signal identical with system clock signal CLK* but delayed from that signal, allowing time for the circuit to react and the data and address in place before the actual write request to memory array MA. The output signals of each of gates L11–14 is low only if the delayed clock signal is high, signal W1 is low (signifying a write request currently recorded on input registers IR1–7), and a corresponding one of signals DBW1–4 is high signifying a write request for the corresponding byte of the data word. If signal W1 is low and any of signals DBW1–4 are high, then the corresponding output signal from gates L11–14 will become low during the time that the delayed clock signal is high and then become high again before the start of the next clock cycle. The output signals from gates L11–14 are presented to byte write input lines WB1–4 of memory array SRAM. Memory array MA writes the byte of data which is currently presented to it on its Din input line to the address presented on the address input line when the respective byte write signal goes low. The data for any write operation is presented to bus DATA I/O* of the chip two clock cycles after the request for write is presented to input registers IR1–7. Bus DATA I/O* is connected to the input of data register DR.

The input line of logic register LR12 is presented with signal R1. On clock cycle (n+2), two cycles after a write request is presented to input registers IR1–7, logic register LR12 records the signal R1 corresponding to that write request. Signal R2, the output signal from logic register LR12, is high if the request presented to input register IR1–7 during cycle (n+1) is a write, causing signal R1 to be high during the start of the (n+2)nd cycle. The output signal from logic register LR12, R2, is presented to an input line of inverter L18 so that the output signal of gate L18, W2, is opposite that of signal R2. The output signal from gate L18, W2, is presented to an input line of gate L15, along with clock enable CEN* and the output signal from logic register LR7, RSC2. The output signal from gate L15, EN2, is low only if signal CEN* is low (indicating that the clock is enabled), signal RSC2 is low (indicating that the chip was selected during the nth cycle, assuming the current cycle is n+2), and signal W2 is low (indicating that the request presented to input registers IRI–7 during the nth cycle was a write request).

Signal EN2 is presented to chip enable input of data register DR so that data register DR records new data from bus DATA I/O* unless a read operation was presented to the chip two cycles ago.

The output data of data register DR, D1, is presented to an input line of a data register DR2. Data register DR2 is also presented with signal EN2 at an enable input so that if a read operation was presented two cycles ago, data register DR2 is disabled. If data registers DR1 and DR2 are disabled by signal EN2, then no data is shifted from DR to DR2 during the current clock cycle.

The output signal from data register DR, D1, is presented to the low-input line of multiplexer M18. The high-input line of multiplexer M18 is connected to the output line of DR2 to receive data D2. The output line of multiplexer M18 is connected to the data input line Din of memory array MA. Signal R2 is presented to an inverter L19 and the output signal from inverter L19 is presented to the input select line of multiplexer M18. Inverter L19 operates as an inverter so that its output signal is logically opposite its input signal. Therefore, if signal R2 is high, data presented to the low-input side of multiplexer M18, data D1, is presented to the input line Din of the SRAM while if signal R2 is low (indicating a read operation was requested two cycles ago), data presented to the high-input side of multiplexer M18, data D2, is forwarded to the input line Din of memory array MA. If there was a read two cycles ago, the data stored in memory array MA which corresponds to address A3 stored in logic register LR6 will reside in data register DR2, otherwise that data resides in data register DR.

If a read request is recorded in input registers IR1–7, control logic CL detects whether the data already resides in control logic CL or whether it needs to be read from memory array SRAM. Address A1 is presented to an input line of comparator C1. The other input line to comparator C1 is presented with address A2 stored in logic register LR1. The output signal from comparator C1, EQ3, is high if addresses A1 and A2 are equal and low if they are not. Similarly, address A1 is presented to comparator C2 along with address A3. The output signal from comparator C2, EQ4, is high if addresses A1 and A3 are equal and low if they are not.

The output signal from comparator C1, EQ3, is presented to an input line of each of NAND gates L20–23. The output signals from logic registers LR2–5, RBW1–4, are connected to corresponding input lines of gates L20–23. The output signals from gates L20–23 are each high unless signal EQ3 is low or the corresponding one of signals RBW1–4 is low.

Note that not all of signals RBW1–4 can be low because logic register LR2–5 is prevented from recording a read operation.

Each of the output signals from gates L20–23 are presented to a corresponding input line of AND gates L24–27. Input lines of each of gates L24–27 are also presented with a corresponding one of signals DBW1–4, signal W2 and signal EQ4. The output signals from gates L24–27, C2(1–4), are each high if signal W2 is high (indicating a read operation request two cycles ago), signal EQ4 is high (indicating that the address to be read matches the address currently stored in logic register LR6), the corresponding output signal from logic registers LR8–11, DBW1–4, is high (indicating that the corresponding byte of data is to be written) and the corresponding output signal from gates L20–23 is high.

The output signals from gates L24–27 are each connected to a respective input select line of multiplexers M6–9. The low-input lines of multiplexers M6–9 are connected to the output data Dout line of memory array MA. The high-input lines of each of multiplexer M6–9 are connected to the output line of data register DR2 to receive a corresponding individual byte of data D2. The output lines of multiplexers M6–9 are connected to a corresponding low-input line of multiplexers M10–13.

The output signal from comparator C1, EQ3, is additionally presented to input lines of each of AND gates L28–31. The output signals from logic registers LR2–5, RBW1–5, respectively, are each presented to a corresponding input line of gates L28–31. In addition, signal W2 is inputted to an input line of each of gates L28–31. Each of the output signals from gates L28–31 are high if signal EQ3 is high (indicating that address A1 equals address A2), signal W2 is high (indicating a read requested two cycles ago), and the corresponding one of signals RBW1–4 is high (indicating a request to write that byte of data).

The output signal from comparator C2, EQ4, is inputted to each of AND gates L32–35 along with signal R2 and a corresponding output signal from logic registers LR8–11, DBW1–4, respectively. The output signal from each of gates L32–35 is high if signal EQ4 is high (indicating that address A1 equals address A3), signal R2 is high (indicating a write request two cycles ago) and the corresponding one of signals DBW1–4 is high (indicating a write request for the corresponding byte of the data word).

The output signals from gates L28–L31 and L32–35 are each inputted to OR gate L40. The output signal from gate L40, C3(1–4),—still comprising four individual signals—is high if either the corresponding output signal from gates L28–31 or the corresponding output signal from gates L32–35 is high. The output signal from gate L40, C3(1–4), is presented to the corresponding input select of multiplexers M10M13.

The high-input lines of multiplexers M10–13 are connected to the output line of data register DR to receive a corresponding byte of data word D1. The output signals from gate L40 choose between the output data from multiplexers M6–9 or data D1 stored on data register DR.

The output signal from comparator C1, EQ3, is also connected to input lines of each of logic gates L36–39. Other input signals presented to gates L36–39 include signal R2 and the corresponding one of signals RBW1–4. The output signals from each of gates L36–39 are high if signal EQ3 is high (indicating that addresses A1 and A2 are equal), signal R2 is high (indicating a write request presented to the chip two cycles ago), and the corresponding one of signals RBW1–4 is high (indicating a write request for that byte).

The output signals from logic gates L36–39, C4(1–4), are presented to the input select lines of multiplexers M14–17. The high input lines of multiplexers M14–17 are connected to bus DATA I/O*. Gates L36–39 choose between the output data from multiplexers M10–13 and the data which is currently presented to the chip bus DATA I/O* for output data.

The output data from multiplexers M14–17, DO(1–4) is presented to the input line of output register OR. Recording the results of the read request in output register OR delays the read output by one clock cycle so that the results of the request are outputted to bus DATA I/O* two clock cycles following the request for the read.

The output data from output register OR, DT(1–4), is presented to output buffer OB. Output buffer OB is enabled by a high signal presented to an enable input line. Gate L16 supplies the signal to the enable input of output buffer OB. Inputs to gate L16 include signals R2, RSC2, and OE*. The output signal from gate L16 is high if output enable OE* is low (allowing the chip to output to the data bus), signal RCS2 is low (indicating a chip select two cycles back), and signal R2 is low (indicating that a read was requested two cycles ago).

Operation of the Double Pipelined Device

FIGS. 6A, 6B and 6C show a timing chart indicating the operation of the circuit shown in FIGS. 5A and 5B by tracking the circuit timing through several operations and through several clock cycles. The operations in the timing chart were chosen to display the features of the circuit, the circuit is capable of handling any number of requests in any order. The sequence starts at an arbitrary time designated as the nth clock cycle. During the sequence, the clock is always enabled (CEN*=low) and selected (CS*=low). Unless otherwise specified, address ai is not the same as address a where i is not j.

nth Clock Cycle—write operation requested

During the nth clock cycle, the chip is presented with a write request to address a0 by setting Address*=a0, GW*=L, and BW1–4*=(L, L, L, L).

(n+1)st Clock Cycle—write request initiated

At the start of the (n+1)st clock cycle (the low to high transition of the clock signal), the write request presented to the chip in the nth clock cycle is recorded in input registers IR1–7. Address A1 becomes a0, signal RCS1 is low, signal G1 is low and signals BWA–D are (L, L, L, L). Signal R1 becomes high and signal W1 becomes low because signals BWA–D are not all high. Signal EN1 is low because signal R1 is high, signal CEN* is low, and signal RCS1 is low (note that for this demonstration signals CEN* and RCS1 will always be low). The output signals from gates L7–10 are all high because signal G1 is low and all of signals BWA–D are low.

During this period, a write request is initiated by setting Address*=a1, GW*=L and BW1–4*=(H, H, L, (n+2)nd Clock Cycle—write request initiated At the beginning of the (n+2)nd clock cycle, logic registers LR1–5 record the signals at their input lines. The output address of LR1, A1, becomes a0 and the output signals from LR2–5, RBW1–4 become (H, H, H, H). Logic register LR12 also records the signal presented to its input so that its output signal, R2, becomes high (H) and signal W2 becomes low (L). Signal EN2 is low because signal W2 is low and signals CEN* and RCS2 are always low for this discussion.

The input signals to the chip are recorded into input registers IR1–7 so that the output signal from input register IR1, A1, becomes a1, the output signal from input register IR3, G1, is low and the output signals from input registers IR4–7 are (H, H, L, L). Signal R1 is high and signal W1 is low. The output signals from gates L7–L10 are all high because signal G1 is low, regardless of the values of signals BWA–D. The output buffer is disabled, signal DB is low, because output enable OE* is set to high and because signal R2 is high.

In addition, the data to be written into address a0, d0, must be presented on bus DATA I/O* during this cycle. A write operation is requested by setting Address*=a2, GW*=H, and BW1–4*=(L,L,L,L).

(n+3)rd cycle—write requested

At the beginning of the (n+3)rd cycle, logic register LR6 records the signal at its input and address A3 becomes a0. Logic registers LR8–11 record the signals at their inputs, signals RBW1–4, and signals DBW1–4 becomes (H, H, H, H).

Logic register LR1 records the signal at its input and address A2 becomes a1. Logic registers LR2–5 record the signals at their inputs and signals RBW1–4 becomes (H, H, H, H). Logic register LR12 records the signal at its input and signal R2 becomes high while signal W2 becomes low.

The control signals presented during the (n+2)nd cycle are recorded in input registers IR1–7 so that address A1 becomes a2, signal G1 becomes high and signals BWA–D become (L, L, L, L). In addition, the data word supplied to bus DATA I/O* is recorded in data register DR so that data D1 becomes d0.

The output signals from gates L7–10 are all high because, even if signal G1 is high, all of signals DBA–B are low. Signal R1 is high and signal W1 is low because signals BWA–D are all low. Signal EN1 is low because signal R1 is high and signal EN2 is low because signal W2 is low. The address stored in logic register LR6, A3=a0, is presented to the address line of memory array SRAM because of the low input signal W1 presented to the input select line of multiplexer M1. As a result of signal R2 being high, data D1 is chosen in multiplexer M18 for presentation to the data input (Din) line of memory array MA.

The output signals from all of logic registers L11–14, which are presented to input lines WB1–4 of memory array SRAM, will all go low during the period when the delayed clock signal is high because signals DBW1–4 are all high and signal W1 is low. Therefore, all bytes of data do are written into address a0 of the memory array SRAM during this clock cycle.

The data to be written into a1, d1, must be presented to bus DATA I/O* during this cycle. In addition, the chip is presented with a write request to address*=a3 with control sequence GW*=H and BW1–4*=(H, H, L, L) (which is a request to write the last two bytes of data d3 into address a3).

(n+4)th cycle read of new address requested

At the beginning of the (n+4)th cycle, logic registers LR1 and LR6 record the signals at their input lines so that address A3 becomes a1 and address A2 becomes a2. Logic registers LR8–11 and LR2–5 record the signals at their input lines so signals DBW1–4 become (H, H, H, H) and signals RBW1–4 become (H, H, H, H). Logic register LR12 records the signal at its input line and signal R2 becomes high, therefore signal W2 will be low. Logic register LR7 records the signal at its input line so that signal RCS2 becomes low. In addition, input registers DR and DR2 record the data presented at their input lines so that data D1 becomes d1 and data D2 becomes do. Input registers IR1–7 record the signals representing the request initiated during the (n+3)rd cycle.

Signal EN2 is low because signal W2 is low and signal RCS2 is low. Signal R1 is high and signal W1 is low because not all of signals BWA–D are high. Signal EN1 is therefore low. The output signals from gates L7–10 are (L, L, H, H) because signal G1 is high and signals BWA–D are (H, H, L, L).

Address A3, a1, is chosen in multiplexer M1 for presentation to the address line of the memory array MA because signal W1 is low. In addition, data D1, d1, is chosen in multiplexer M18 for presentation to input line Din of memory array MA because signal R2 is high. The output signals from gates L11–14 will all go low during this cycle because signal W1 is low and signals DBW1–4 are all high. Therefore, all bytes of data word di are written into address a1 of memory array MA.

During this cycle, the data to be written into address a2, d2, must be presented to the chip on bus DATA I/O*. In addition, the chip is presented with a read request by setting Address*=a4, GW*=L and BW14*=(H, H, H, H).

(n+5)th cycle—read from address currently being written is requested.

At the start of the (n+5)th cycle, all of the registers record the signals at their inputs so that address A3 becomes a2, address A2 becomes a3, address A1 becomes a4, signals DBW1–4 becomes (H, H, H, H), signals RBW1–4 becomes (L, L, H, H), data D2 becomes d1, data D1 becomes d2, signal R2 becomes high, signal RCS2 becomes low, signal G1 becomes low and signals BWA–D are (H, H, H, H).

As a result of the high value of all of signals BWA–D, signal R1 is low and signal W1 is high. Therefore, signal EN1 is high. Signal EN2 is low because signal R2 is high and signal W2 is low. As a result of signal R2 being high, data D1, d2, is presented to the Din line of memory array MA. As a result of signal W1 being high, address A1, a4, is presented to the address input line of memory array MA. Therefore, the data stored in address a4 of memory array MA, Da4, will be presented on the Dout line of memory array MA.

The output signals from gates L11–14 will remain high throughout the cycle because signal W1 is high. Therefore, no write to memory array MA takes place during this cycle.

The read operation represented by control signals stored in input registers IR1–7 is completely processed during this cycle. The output signals from comparators C1 and C2, EQ3 and EQ4 respectively, are low because address A1 (a4) is not address A2 (a3) and address A1 (a4) is not address A3 (a2). The output signals from gates L20–23 are all high regardless of the contents of signals RBW1–4 because signal EQ3 is low. Similarly, the output signals from gates L24–27, C2(1–4), are all low because signals W2 and EQ4 are low, regardless of signals DBW1–4. As a result, the output signals from multiplexers M6–9 are the corresponding bytes of data word Da4.

The output signals from gates L28–31 are all low because signal EQ3 is low and signal W2 is low. In addition, the output signals from gates L32–35 are all low because signal EQ4 is low. Therefore, the output signals from gate L40, C3(1–4), are (L, L, L, L). Multiplexers M10–13, then, output the values at their low inputs, the corresponding bytes of data word Da4.

Finally, the output signals from gates L36–39, C4(1–4), are all low because signal EQ3 is low. The output values from multiplexers M14–17, DO(1–4), are therefore data word Da4.

During this cycle, the data to be written into address a3 must be presented to the chip on bus DATA I/O*. In addition, the chip is presented with a read request by setting Address*=a3, GW*=H, and BW1–4*=(H, H, H, H). Note that the address presented for read, a3, is that address which currently resides in logic register LR1.

(n+6)th cycle—write initiated

At the beginning of the (n+6)th cycle, logic registers LR1–6 and LR8–11 are all disabled from recording new data because signal EN1 is high. Therefore, each of these registers retains the value that they had during the (n+5)th cycle. Data registers DR and DR2, however, are not disabled so that data D2 becomes d2 and data D1 becomes d3. In addition, logic registers LR7 and LR12 record the signals at their input lines so that signal RSC2 becomes low and signal R2 low. Input registers IR1–7 record the new control signals so that signal G1 becomes high and signals BWA–D become (H, H, H, H). Output register OR records the value at its input and so data word DT(1–4) becomes data word Da4.

As a result of having signal value R2 being low, signal W2 becomes high and data D2, d2, is presented to data input line Din of memory array MA, and signal EN2 becomes high. As a result of signal R1 being low, signal EN1 remains low, signal W1 is high, address A1 (a3) is presented to the address line of memory array MA, and the output signals from gates L11–14 remain high during the cycle, indicating that memory array MA will not execute a write operation on this cycle.

Output enable OE* must be set to low on this cycle. With output enable OE* low and signal R2 low, the output signal from gate L16, DB, is high and output buffer OB is enabled. Therefore, data word DT(1–4) (Da4) is placed on data bus DATA I/O* by the chip. Therefore, Da4 is presented by the chip in response to the read request to memory location a4.

The output signal from comparator C1, EQ3, is high because address A1 (a3) is equal to address A2 (a3). The output signal from comparator C2, EQ4, is low because address A1 (a3) is not the same as address A3 (a2).

The output signals from gates L20–23 are (H, H, L, L) because signal EQ3 is high while signals RBW1–2 are low and signals RBW3–4 are high. Signal EQ4 is low, however, so the output signals from gates L24–27, C2(1–4), are low regardless of the output signals from gates L20–23 or signals DBW1–4. The low input sides of multiplexers M6–9 are chosen and multiplexers M6–9 output the data value present at line Dout of memory array MA. In this case, the data stored in memory location a3 of memory array MA, Da3, is presented at line Dout.

The output signals from gates L28–31 are (L, L, H, H) because signal EQ3 is high, signal W2 is high and signals RBW1–4 are (L, L, H, H). The output signals from gates L32–35 are low because signal EQ4 is low and signal R2 is low, regardless of the values of signals DBW1–4. Therefore, the output signals from gate L40, (C3(1–4), are (L, L, H, H). The output values from multiplexers M14–17, then, are represented as (Da3, Da3, d3, d3) (i.e., the first byte of data word Da3, byte two of data word Da3, byte three of data word d3 and byte 4 of data word d3).

The output signals from gates L36–39, C4(1–4), are low because signal R2 is low. Therefore, multiplexers M14–17 output the values on their low input lines. The output values from multiplexers M14–17, DO(1–4), are (Da3, Da3, d3, d3), the first two bytes of the contents of memory array MA at address a3 (Da3) and the last two bytes of data word d3, the part that is to be written into the SRAM, stored in control logic CL.

During this cycle, the chip is presented with a write request by setting Address*=a5, GW*=L, and BW1–4*=(L, L, L, L).

(n+7)th clock cycle—write requested

At the beginning of the (n+7)th cycle, logic registers LR1–6, and LR8–11 are disabled because signal EN1 is high at the time of transition. Both data registers DR and DR2 are disabled because signal EN2 is high. These registers, then, do not record new data.

Logic register LR12 records the signal at its input so that signal R2 becomes low and signal W2 becomes high. Logic register LR7 records the signal presented to its input so that signal RCS2 is low. Signal EN2 is high because W2 is high, thereby disabling data registers DR and DR2 for one more cycle.

Output register OR records the value presented at its input so that data word DT(1–4) becomes (Da3, Da3, d3, d3). During this cycle, output enable OE* must be set to low so that the output signal from gate L16, DB, becomes high and output buffer OB is enabled. Data word DT(1–4) is therefore presented to bus DATA I/O* in response to the read request presented during the (n+5)th cycle.

Input registers IR1–7 all record the signal at their inputs so that address A1 becomes a5, signal gi becomes low, and signals BWA–D become (L, L, L, L). Signal R1 is high because signals BWA–D are all low. Therefore, signal W1 is low and signal EN1 is low, thereby enabling the previously disabled logic registers LR1–6 and LR8–11.

Multiplexer M1 presents the address input of multiplexer array MA with address A3 (a2) because signal W1 is low. In addition, multiplexer M18 presents the Din line of multiplier array MA with data D2 (d2), because signal R2 is low. The output signals from gates L11–14 will all go low during the cycle because signal W1 is low and signals DBW1–4 are all high. Therefore, all bytes of data word d2 will be written into address a2.

During this cycle, the chip is presented with a write request by setting Address*=a6, GW*=H, and BW1–4* to (L, L, H, H).

(n+7)th through (n+10)th cycles

At this point, it is more informative to jump ahead in FIG. 6 to clock cycles 11–15, which presents the case of two writes to the same address of differing bytes of a data word followed by two reads of that address.

(n+11)th clock cycle—write request to a8 initiated

During this clock cycle, the chip is presented with a write request by setting Address*=a8, GW*=H, and BW1–4*=(L, L, H, H).

(n+12)th clock cycle—write request to a8 initiated

At the beginning of the (n+12)th cycle, the write request presented during the (n+11)th cycle is recorded in input register IR1–7. Therefore, address A1 becomes a8, signal G1 become high and signals DWA–D become (L, L, H, H). Signals RCS1 and RCS2 are always low in this example because the chip is assumed always to be selected.

Signal R1 is high and signal W1 is low because all of signals DBA–D are not high. Therefore, signal EN1 is low. The output signals from gates L7–10 are (H, H, L, L) because signal G1 is high and signals DWA–D are (L, L, H, H).

During this clock cycle, the chip is presented with another write request to address a8 by setting Address*=a8, GW*= H, and BW1–4*=(H, H, L, L). This is a request to write to the half of the data word not requested during the (n+11)th cycle.

(n+13)th cycle—request to read address a8.

At the beginning of the (n+13)th cycle, logic register LR1 records the value at its input so that address A2 becomes a8. Logic registers LR2–5 record the signals at their inputs so that signals RBW1–4 becomes (H, H, L, L). Logic register LR12 records the signal at its input and signal R2 becomes high. The write requested in the (n+12)th cycle is recorded in input registers IR1–7 so that address A1 becomes a8, signal G1 becomes high, and signals BWA–D become (H, H, L, L).

As a result of signal R2 being high, signal W2 is low so that signal EN2 is low. Signal R1 is high because signals BWA–D are not all high, so signal W1 is low and signal EN1 is low. The output signals from gates L7–10 are (L, L, H, H) because of signals G1 and BWA–D.

During this cycle, the chip must be presented with the data for the write request presented to it in cycle (n+11) so the data word d8A is presented on bus DATA I/O* line. The chip is also presented with a read request for address a8 by setting Address*=a8, GW*=H, and BW1–4*=(H, H, H, H).
(n+14)th request to read address a8

At the beginning of the (n+14)th clock cycle, logic registers LR1 and LR6 record the values at their inputs so address A3 becomes a8 and address A2 becomes a8. Logic registers LR8–11 and LR2–5 record the signals at their inputs so signals DBW1–4 become (H, H, L, L) and signals RBW1–4 become (L, L, H, H). Logic register LR12 records and signal R2 becomes high. The read request signals are recorded in input registers IR1–7 so that address A1 become a8, signal G1 becomes high, and signals BW1–4 become (H, H, H, H). Data register DR records so that data D1 becomes data word d8A. The data for the write requested in cycle (n+12), d8B, must be presented to bus DATA I/O* of the chip during this cycle.

Signal W2 is low because signal R2 is high. Therefore, signal EN2 is low. All of signals DBA–D are high so signal R1 is low. Both signals W1 and EN1 are therefore high. The output signals from gates L7–10 are all low because signal GW is high and signals BWA–D are all high. Signal R2 is high so that data D1 (d8A) is presented to the Din line of memory array MA.

Address A1 (a8) is chosen in multiplexer M1 for presentation to the address input of memory array SRAM because signal W1 is high. In addition, because signal W1 is high, the output signals from gates L11–14 will remain high throughout the cycle, which means that no write is undertaken by memory array MA on this cycle.

The output signals from comparators C1 and C2, EQ3 and EQ4, are both high because addresses A1, A2 and A3 are all a8.

The output signals from gates L24–27, C2(1–4), are all low because signal W2 is low, regardless of the output signals from gates L20–23 or the values of signals DBW1–4. Therefore, the contents of memory array MA at address a8, data word Da8, is presented at line Dout of memory array MA and chosen in multiplexers M6–9 for presentation on their output lines.

The output signals from gates L28–L31 are all low because signal W2 is low. The output signals from gates L32–35, however, are (H, H, L, L) because signal R2 is high, signal EQ4 is high, and signals DBW1–4 are (H, H, L, L). The output signals from gate L40, C3(1–4), therefore, are (H, H, L, L). The high-input lines of multiplexers M10–11 are chosen and the low-input lines of multiplexers M12–13 are chosen. Multiplexers M10–13 therefore output the data word (d8A, d8A, Da8, Da8).

The output signals from gates L36–39, C4(1–4), are (L, L, H, H) because signal EQ3 is high, signal R2 is high, and signals RBW1–4 are (L, L, H, H). The low inputs of multiplexers M14–15 and the high inputs of multiplexers M16–17 are chosen causing the output value of multiplexers M14–17, DO(1–4), to be (d8A, d8A, d8B, d8B).

The chip is presented with another read to memory location a8 during this cycle by setting Address*=a8, GW*=H, and BW1–4*=(H, H, H, H).
(n+15)th cycle At the start of the (n+15)th cycle, logic registers LR1–6 and LR8–11 are disabled from recording new values because signal EN1 is high. Register LR12 records the signal at its input so signal R2 is low. In addition, data registers DR and DR2 record the values at their inputs so that data D2 becomes d8A and data D1 becomes d8B.

Output register OR records the value at its input line so that data word DT(1–4) becomes (d8A, d8A, d8B, d8B). Output enable OE* must be set to low during this cycle. The output signal from gate L16, DB, is then high because signal OE* is low and signal R2 is low. With signal DB being high, output buffer OB is enabled and data word DT(1–4) is presented by the chip to bus DATA I/O*.

The control signals for the new read request are recorded by input registers IR1–7 so that address A1 becomes a8, signal G1 becomes high, and signals BWA–D become (H, H, H, H). With these values, signal R1 is low, signal W1 is high and signal EN1 is high. With signal R2 being high, signal W2 is low, and signal EN2 is high. The output signals from gates L11–14 will remain high throughout the cycle because signal W1 is high, therefore the memory array MA will not write during this cycle.

Address A1 (a8) is chosen in multiplexer M1 for presentation to the address input of memory array SRAM because signal W1 is high. The data in memory array MA at address a8 (Da8) is presented at line Dout of memory array MA.

The output signals from comparators C1 and C2, EQ3 and EQ4, are both high because address A1, a8, is the same as addresses A2 and A3, all of them being a8.

The output signals from gates L20–23 are (H, H, L, L) because signal EQ3 is high and signals RBW1–4 are (L, L, H, H). The output signals from gates L24–27, C2(1–4), are (H, H, L, L) because signal W2 is high, signal EQ4 is high, and signals DBW1–4 are (H, H, L, L). The high input lines of multiplexers M6–7 and the low input lines of multiplexers M8–9 are selected. The output values of multiplexers M6–9, then, are (d8A, d8A, Da8, Da8).

Gates L28–31 output the signals (L, L, H, H) because signal EQ3 is high, signal W2 is high, and signals RBW1–4 are (L, L, H, H). Gates L32–35 output the signals (L, L, L, L) because signal R2 is low. Therefore, the output signals from gate L40, C3(1–4), are (L, L, H, H). The low input lines of multiplexers M10–11 and the high input lines of multiplexers M12–13 are therefore chosen. The output values from multiplexers M10–13, then, are (d8A, d8A, d8B, d8B).

Figure 7:
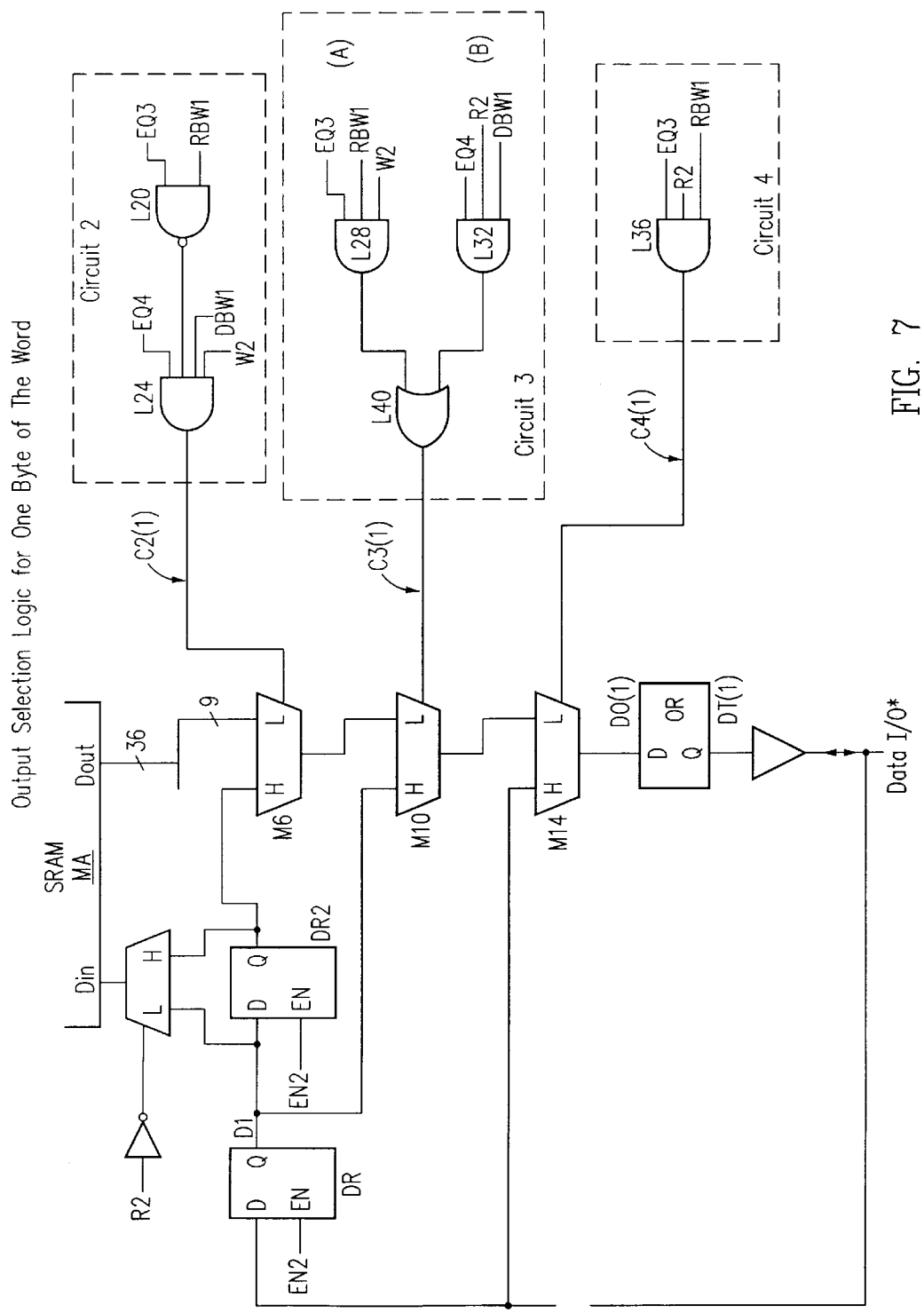
FIG. 7 shows a circuit diagram for the selection logic circuit for selecting one byte of the word in the double pipeline embodiment.

The output signals from gates L36–39 are (L, L, L, L) because signal R2 is low. Therefore, multiplexers M14–17 choose their low-input lines for output and data word DO(1–4) becomes (d8A, d8A, d8B, d8B). Data word DO(1–4) is recorded by output register OR and presented to bus DATA I/O* on the next clock cycle.
Operation of the output selection logic The output selection logic for the circuit described in FIGS. 5A and 5B is isolated and displayed in FIG. 7. For simplicity, FIG. 7 shows the selection logic for one byte of a data word. In addition, the components are labeled identically with those of FIG. 5.

The low-input line of multiplexer M6 is connected to line Dout of memory array MA to receive a byte of the data word on line Dout. The high-input side is connected to receive a corresponding byte from data register DR2. The input selection line of multiplier M6 is connected to the output line of circuit 2. The logic of circuit 2 is such that signal C2 at the output line of circuit 2 is high if either signal EQ3 or signal RBW1 are low and signals EQ4, DBW1 and W2 are all high.

The low input side of multiplexer M10 is connected to the output line of multiplexer M6 while the high input side is connected to the output line of data register DR to receive a corresponding byte of data word D1. The input select line of multiplexer M10 is connected to the output line of circuit 3 to receive the signal C3. The high-input line of M10 is selected if signals EQ3, RBW1, and W2 are all high or if signals EQ4, R2, and DBW1 are all high.

The output line of multiplexer M10 is connected to the low-input line of multiplexer M14. The high-input line of multiplexer M14 is connected to bus DATA I/O* to receive the input data word. The input select line of multiplexer M14 is connected to the output line of circuit 4 to receive the signal C4. The high-input line of multiplexer M14 is chosen for output if signals EQ3, R2 and RBW1 are all high.

FIGS. 8A through 8I outline the operation of the output select logic shown by circuits 2, 3, and 4 of FIG. 7. For purposes of this discussion, the following sequence of operations shown in FIG. 8A is assumed: a write request to a1, a write request to a2, a write request to a3, a read of address ax, and a read of address ay. Unless otherwise specified, the addresses used are all unique.

If the sequence is started by presenting the first write request in the nth cycle, then, as shown in FIG. 8A, in the (n+3)rd cycle, address A1 is a3, address A2 is a2, address A3 is a1, data D1 is d1, signal R1 is high and signal R2 is high. During that sequence, the chip is presented with a read request for address ax and the data word to be written into address a2.

In the (n+4)th cycle, the read request initiated during the (n+3)rd cycle will be performed. During this cycle, address A1 is ax, address A2 is a3, address A3 is a2, data D1 is d2, data D2 is d1, signal R1 is low and signal R2 is high. In addition, the data to be written into address a3 is presented to bus DATA I/O*.

In FIG. 8B, the case of ax equal to a3 and not equal to a2 is analyzed. In that case, signal EQ3 is high and signal EQ4 is low. The chip, then, must capture the byte of data from bus DATA I/O* if that byte is to be written into memory array SRAM. Therefore, the output signals from Circuit 2 and Circuit 3 both choose the low input lines of multiplexers M6 and M10 respectively so that multiplexer M14 is presented with the output value from memory array SRAM, Da3, on the low-input line and bus DATA I/O*, d3, on the high-input line. The output signal from circuit 4 chooses the high input side if the corresponding control signal RBW1 calls for a write of that byte. Otherwise, the contents of the SRAM are chosen for output.

If address ax is equal to a2 and not equal to a3, then signals EQ3=L and EQ4=H, as in FIG. 8C, and the data corresponding to the read request is d2 and resides on data register DR, provided that byte is to be written. Therefore, the output signal from circuit 2 chooses the low input line of multiplexer M6 and forwards the output value from line Dout to the low-input line of multiplexer M10. Circuit 3(A) chooses the low-input line of multiplexer M10, but Circuit 3(B) chooses the high-input line of multiplexer M10 if the control signal DBW1 is high. Circuit 4 chooses the low-input line of multiplexer M14. Therefore, data word byte d2 is forwarded to output register OR if that byte is to be written, otherwise data byte Da2 is forwarded to output register OR.

If address ax is the same as both a3 and a2, as in FIG. 8D, then the logic circuit must choose data byte d3 if that is to be written, data byte d2 if data byte d2 is to be written and data byte d3 is not to be written, and the output value from line Dout if neither data byte d2 nor data byte d3 is to be written. Circuit 2 chooses the low input line of M6 because signal R2 is high (making signal W2 low) and the output value from line Dout is forwarded to the low-input line of multiplexer M10. Circuit 3(A) chooses the low-input line of multiplexer M10 because signal W2 is low, but circuit 3(B) chooses the high input line if that byte of data byte d2 is to be written. The output signal from circuit 3, C4, chooses the high-input line of multiplexer M14 if that byte of data byte d3 is to be written. Therefore, data D0 is d3 if that byte is written, d2 if d3 is not written but d2 is, and Da3 if neither d2 nor d3 are written.

If ax is neither a3 nor a2, as is shown in FIG. 8E, all three circuits choose the low-input lines of their respective multiplexers and Dax, the data byte at line Dout, is presented to output register OR.

During the (n+5)th cycle shown in FIG. 8A, the read request initiated in the (n+4)th cycle is processed. During cycle (n+5), A1=ay, A2=a3, A3=a2, D1=d3 and D2=d2. The logic registers are disabled but the new data is recorded in the data registers. On this cycle, the data corresponding to write address a3, d3, is data D1 and the data corresponding to write address a2, d2, is data D2. In addition, signals R2 and R1 are both low.

In FIG. 8F, ay is equal to a3 and not equal to a2 so signal EQ3 is high and signal EQ4 is low. Circuit 2 chooses the low-input line of multiplexer M6 because signal EQ4 is low. Therefore, the data stored in address a3 of multiplexer array MA, Da3, is presented to the low-input line of multiplexer M10. Circuit 3 will choose the high-input line of multiplexer M10, d3, if that byte is to be written because Circuit 3(A) will choose the high-input line. Circuit 3(B) chooses the low input line because signal R2 is low. Circuit 4 chooses the low-input line of multiplexer M14 if signal R2 is low. Therefore, data D1, d3, is presented to output register OR if that data is to be written during a corresponding write operation.

In FIG. 8G, ay is equal to a2 and not equal to a3 so signal EQ3 is low and signal EQ4 is high. Circuit 1 chooses the high-input line of multiplexer M6 provided that that byte of data word d2 will be written into memory array MA. Circuit 3(A) chooses the low-input line of multiplexer M10 because signal EQ3 is low and circuit 3(B) chooses the low-input line of multiplexer M10 because signal R2 is low. Therefore, Circuit 3 chooses the low-input line of multiplexer M10. Circuit 4 chooses the low-input line of multiplexer M14 because signal EQ3 is low. Therefore, output register OR is presented with data D2 (d2) if d2 is to be written into memory array MA, and the contents of memory array MA at a2 (Da2) if d2 is not to be written into memory array MA.

In FIG. 8H, ay is equal to both a3 and a2. Signals EQ3 and EQ4 are both high. Circuit 2 chooses the high-input line of multiplexer M6 if that byte of data d3 is not to be written (signal RBW1 is low) and if that byte of data d2 is to be written (signal DBW1 is high). Circuit 3(A) chooses the high-input line of multiplexer M10 if d3 is to be written. Circuit 3 follows Circuit 3(A) because Circuit 3(B) chooses the low-input line of multiplexer M10 as a result of signal R2 being low. Circuit 4 chooses the low-input line of multiplexer M14 because signal R2 is low. Therefore, output register OR is presented with d2 if that byte of d2 is to be written and that byte of d3 is not to be written, d3 if that byte of d3 is to be written, and Da3, from memory array MA, otherwise.

FIG. 8I investigates the case where ay is not a3 or a2. In that case, all of the logic circuits choose the low-input lines of their respective multiplexers and output register OR is presented with the contents of memory array MA at address ay, Day.

The combined operation chip

FIGS. 9A, 9B 9C, 9D and 9E show a circuit diagram for an embodiment of the invention which operates in either a single pipeline mode or a double pipeline mode. As is seen from the diagram, it is a combination of the circuits shown in FIGS. 2A and 2B and in FIGS. 5A and 5B. The components in this diagram are labeled consistently with those of FIGS. 2A and 2B and FIGS. 5A and 5B. The differences between FIGS. 5A and 5B, the double pipelined device (DPD), and FIGS. 2A and 2B, the single pipelined device (SPD), are discussed along with this discussion of FIGS. 9A, 9B, 9C, 9D and 9E.

The circuit of FIGS. 9A, 9B, 9C, 9D and 9E includes a new input signal, S/D*, which is low for double pipeline operation and high for single pipeline operation. Otherwise, the input signals are identical to those described in FIGS. 2A and 2B and 5A and 5B.

In the SPD (FIGS. 2A and 2B), the output lines of logic registers LR2–5 are connected directly to input lines of gates L11–14. In DPD (FIGS. 5A and 5B), the output lines of logic registers LR2–5 are connected to the input lines of logic registers LR8–11 and output lines from logic registers LR8–11 are connected to input lines of gates L11–14.

In FIGS. 9A, 9B, 9C, 9D and 9E, output lines of logic registers LR2–5 are connected to the high-input lines of multiplexers M23–26 as well as the input lines of logic registers LR8–11. The high-input line of multiplexers M23–26 are connected to the output lines of logic registers LR8–11, respectively. The output lines of multiplexers M23–26 are each connected to an input line of gates L11–14. The input select line for M23–26 receives signal S/D* so that for single pipeline operation gates L11–14 are presented with the outputs of logic registers LR2–5 and for double pipeline operation gates L11–14 are presented with the outputs of logic registers LR8–11.

In the SPD, the output line of logic register LR1 is connected directly to the low-input line of multiplexer M1 whereas in the DPD, the output line of logic register LR1 is connected to the input line of logic register LR6 and the output line of logic register LR6 is connected to the low-input line of multiplexer M1. In FIGS. 9A, 9B, 9C, 9D and 9E, multiplexer M22 is used such that the low-input line of multiplexer M22 is connected to the output line of logic register LR6 while the high-input line of multiplexer M22 is connected to the output line of logic register LR1. The output line of multiplexer M22 is connected to the low-input line of multiplexer M1. The input select line of multiplexer M22 is connected to receive signal S/D* so that in single pipeline mode, the low-input line of multiplexer M1 is presented with the output signal from logic register LR1 while in double pipeline mode the low-input line of multiplexer M1 is presented with the output signal from logic register LR6.

Also in the SPD, the input lines to gate L15 include the output line from gate L17 and the output line of input register IR2 whereas in the DPD, the input lines to gate L15 include the output line of gate L18 and the output line of input register IR7 instead. In FIGS. 9A, 9B, 9C, 9D and 9E, the output line of gate L17 is connected to the high-input line of multiplexer M27 and the output line of gate L18 is connected to the low-input side of multiplexer M27. The output line of multiplexer M27 is connected to an input line of gate L15. In addition, signal RCS1 is presented to the high-input line of multiplexer M29 and signal RCS2 is presented to the low-input line of multiplexer M29. The output line of multiplexer M29 is connected to an input line of gate L15. The input select line of multiplexers M27 and M28 are connected to receive signal S/D* so that gate L15 is presented with signals W1 and RCS1 for single pipeline operation and signals W2 and RCS2 for double pipeline operation.

In the SPD, the input signals to gate L16 include OE*, RCS1 and R1 while in the DPD the input signals include OE*, RCS2 and R2. In FIGS. 9A, 9B, 9C, 9D and 9E, one input line of gate L16 is connected to receive signal OE*, another input line to the output line of multiplexer M28, and a third input line to the output line of multiplexer M29. The low-input line of multiplexer M29 receives signal R2 and the high-input line of multiplexer M29 receives signal R1. The input select line of multiplexer M29 is connected to receive signal S/D*. Therefore, gate L16 is presented with the proper input signals depending on the operation of the circuit.

The Din input line of memory array MA is connected directly to the output line of data register DR in the SPD case while in the DPD the Din input line is connected to the output line of multiplexer M18. The low-input line of multiplexer M18 is connected to the output line of data register DR and the high-input line is connected to the output line of data register DR2. The input select line of multiplexer M18 is connected to the output line of gate L19. The input signal to gate L19 is R2. In FIGS. 9A, 9B, 9C, 9D and 9E, the Din input of memory array MA is connected to the output line of multiplexer M18 where the input lines of multiplexer M18 are connected the same as in the DPD. Gate L19, however, is an AND gate, rather than a NOT gate, and inputs signals R2 and S/D* such that if signal S/D* is high, the low-input line of multiplexer M18 is always selected and if signal S/D* is low, gate L19 acts as an inverter for signal R2.

Finally, in the SPD the output select circuitry consists of gates L3–6 and multiplexers M2–5. In the DPD, however, the output select circuitry consists of gates L20–40 and multiplexers M6–17. In addition, output register OR is added to the DPD in order to preserve the timing. In FIGS. 9A, 9B, 9C, 9D and 9E, line Dout of memory array MA is connected to the low-input lines of multiplexers M2–5 as in the SPD. It is also connected to the low-input lines of multiplexers M6–9 as in the DPD. The output lines of multiplexers M2–5 are connected to the high-input lines of multiplexers M18–21. The low input lines of multiplexers M18–21 are connected to the output lines of output register OR. The output lines of multiplexers M18–21 are connected to output buffer OB. The input select line of M18–21 are connected to receive signal S/D* so that output buffer OB is presented with the single-pipeline output selection if in single pipeline mode and the double-pipeline output selection if in double pipeline mode.

A feature of these devices is that they internally pipeline requests to memory array MA. There are no restrictions on what piece of data may be accessed. If a write to address a is followed by a read of address a, the proper data which was just posted is routed to the output to properly handle the read request. Additional requirements of these devices are that they allow individual byte writes to each address. These devices recognize when a partial write to address a is followed by a read of a and routes the proper data to output the whole word corresponding to address a.

It is a requirement of the user to insure that the signals into this device meet the required setup and holds so as to prevent any metastability. Setup and hold times should be designed to have a maximum requirement of 1 ns. This will allow the device to be used in systems as fast as 150 Mhz.

When running at a frequency approaching 150 Mhz, the entire write cycle must complete in 6.6 ns in order to occur within a single write cycle. The additional overhead delay through the multiplexers in front of the "data in" port of the RAM is subtracted from the cycle time.

Other Embodiments

The circuit shown in FIGS. 9A, 9B, 9C, 9D and 9E, as implemented on the integrated circuit shown in Appendix A, presents the preferred embodiment of the invention. Alternative embodiments include the single pipeline device of FIGS. 2A and 2B and the double pipeline embodiment of FIGS. 5A and 5B. Variations on these embodiments, such as differing logic circuit in either the write portions or the read selection portions, may be used and are within the scope of this invention. The circuits shown in the examples display a logic circuit and the necessary priorities for reading data from the circuit.

Figure 9A:
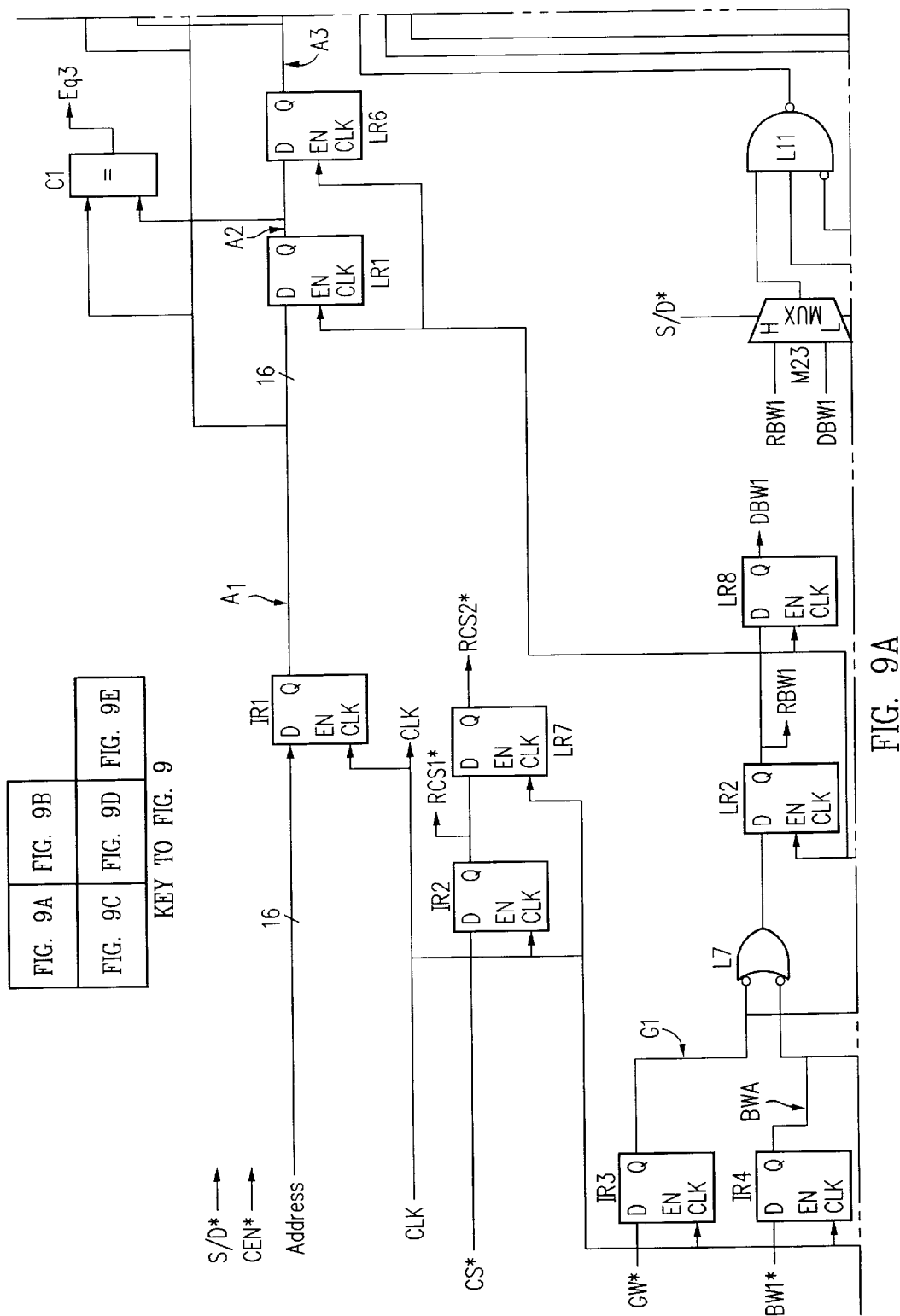
FIGS. 9A–9E show the circuit diagram for the preferred embodiment of the invention.
Figure 9B:
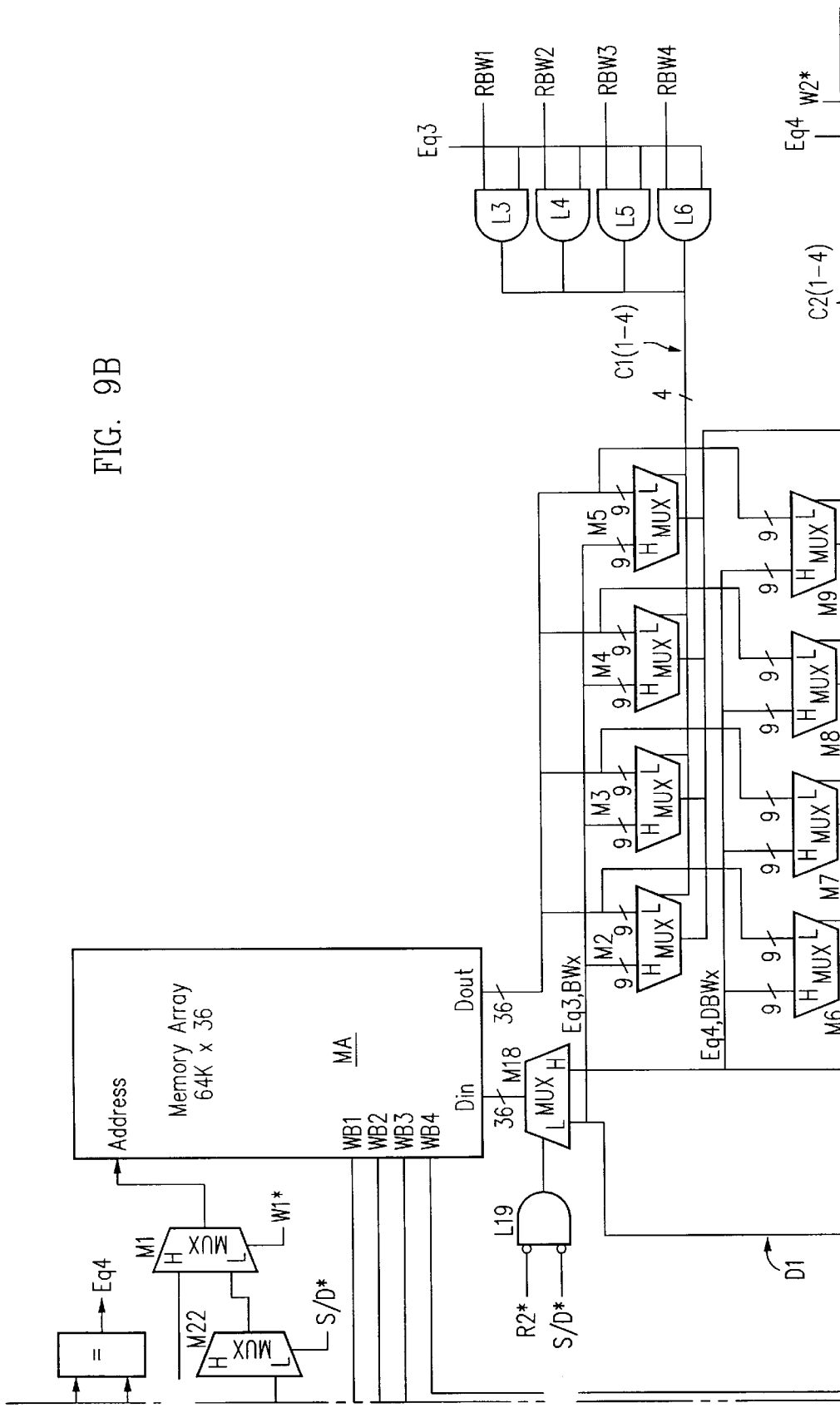
Figure 9C:
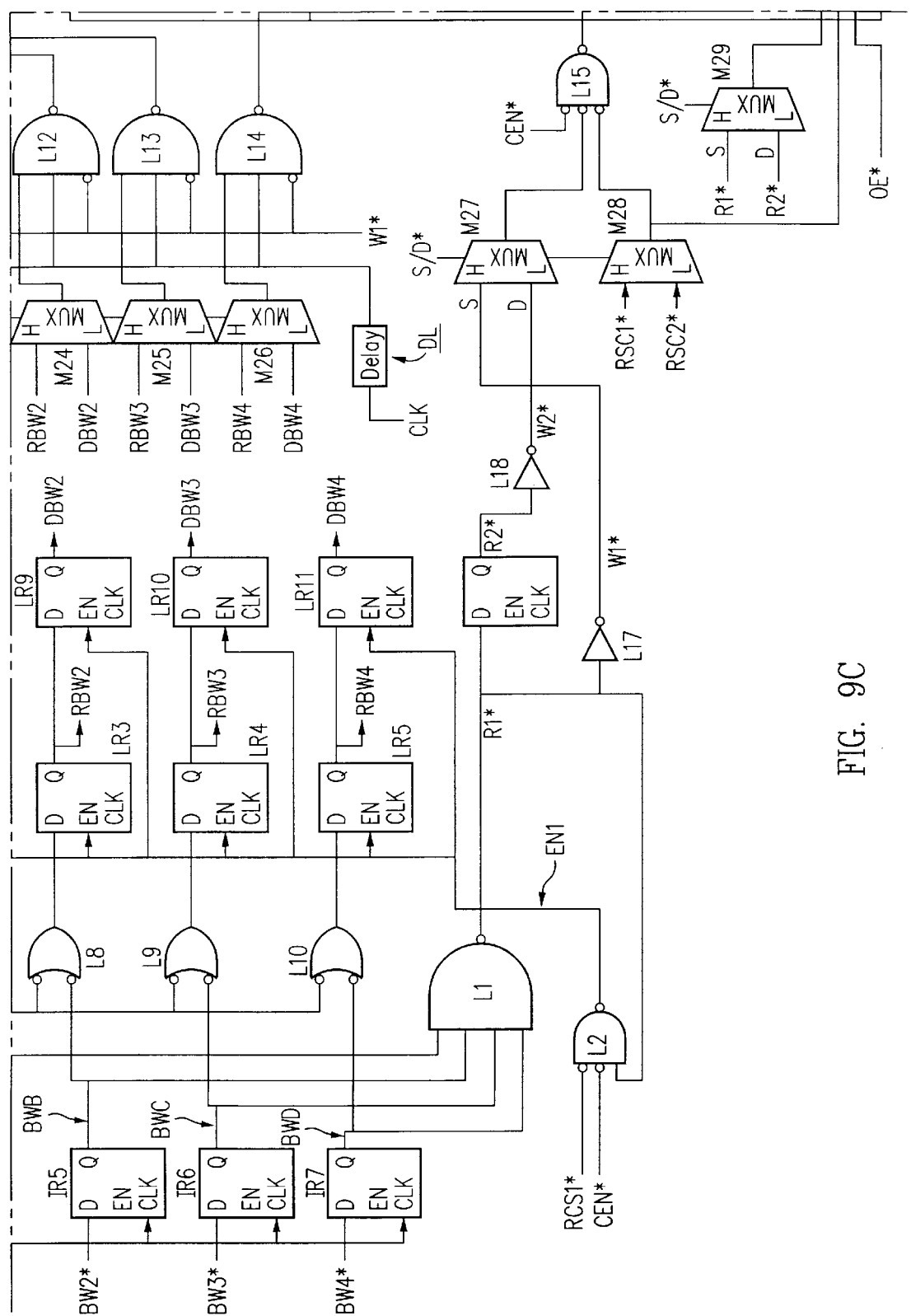
Figure 9D:
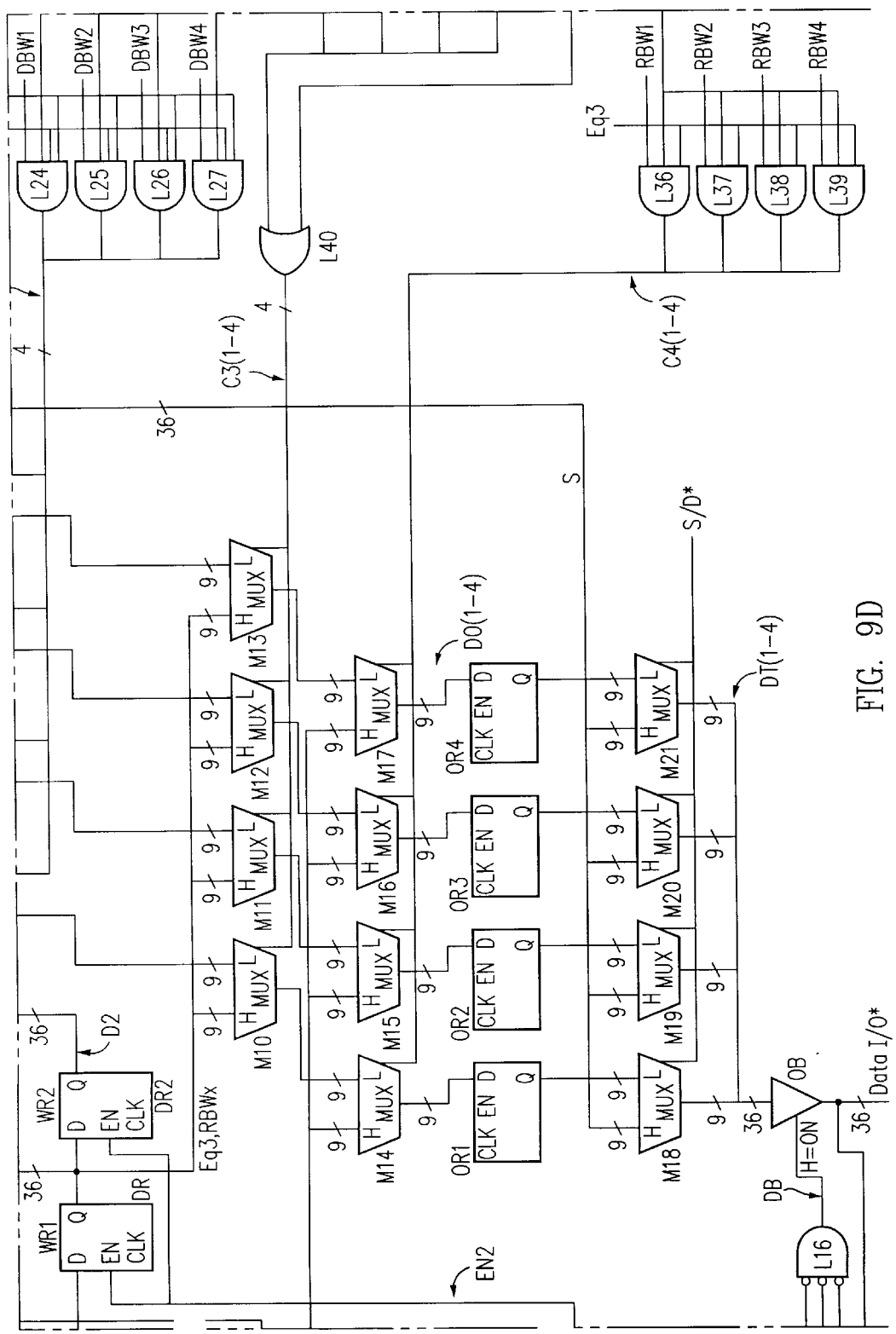
Figure 9E:
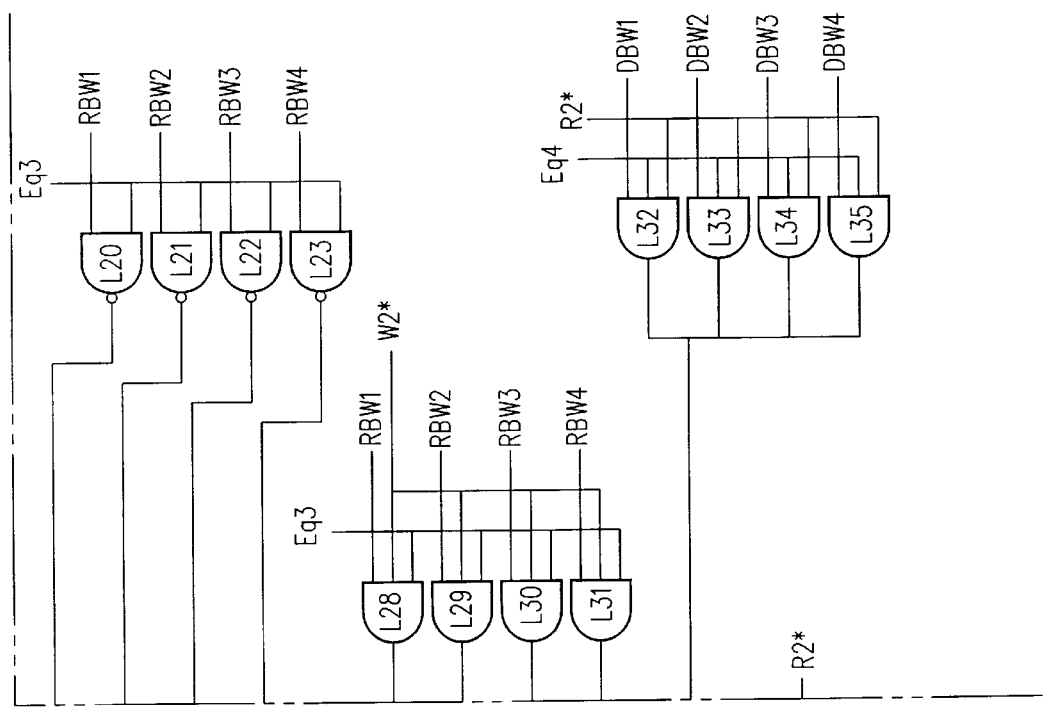

Also, embodiments involving three or more pipeline delays, although requiring careful attention to timing, will be obvious in view of this disclosure. While a single DATA I/O* terminal is shown in FIGS. 2,5 and 9B, separate data input and data output lines may be used. DRAM memories may also be used in place of the SRAM memories shown as memory arrays in the Figures.

In the preferred embodiment, addresses are 16 bits and data words have four bytes of 9 bits each. Alternative embodiments include those with addresses of any size and data words of any size with any number of bytes making up the data word.

The embodiments shown here are demonstrative only. Other variations of these embodiments are within the scope of this application. As such, the scope of the application is limited only by the following claims.

We claim:

1. A synchronous random access memory system, comprising:
   a memory having a memory structure for receiving an input data word to be written into the memory and for receiving an output data word from the memory, the input data word and the output data word each comprising at least two bytes, and the memory being capable of separately writing each byte of the input data word to an address in response to a set of at least two control signals and of outputting the output data word corresponding to the address;
      a set of input registers, comprising an input address register for storing an input address to which data is to be written into the memory or from which data is to be read from the memory system, and
      a set of input control registers for storing the at least two control signals for controlling the writing of data to the memory or the reading of data from the memory system;
   an address bus terminal coupled to the input address register for receiving the input address;
   a control terminal coupled to the input control registers for receiving the at least two control signals;
   a data structure for receiving a write data word to be written into the memory and for receiving a read data word which was read from the memory, the write data word and the read data word each consisting of at least two bytes; and
   a control logic which is coupled to the input registers to receive the input address from the input address register and the at least two control signals from the input control registers, the control logic also being coupled to the data structure such that the control logic receives the write data word to be written into the memory from the data structure and the data structure receives the read data word which was read from the memory system, the control logic also being coupled to the memory in order to send the input data word to the memory, receive the output data word from the memory, send the at least two control signals to the memory, and send the input address to the memory, the control logic comprising
      at least one logic address register for storing an address to which data is to be written in the memory,
      a set of logic control registers for storing the at least two control signals,
      at least one data storage register for storing the write data word to be written into the memory,
      a write logic for regulating the presentation of the address, the control signals, and the write data word to the memory, the write logic being capable of detecting a read request and suspending presentation of a write command to the memory, and
      a read logic capable of detecting a read request on the input registers and choosing the read data word from bytes of data that are stored in the memory and from bytes of data that are stored in the control logic in order to send the data structure the read data word corresponding to the input address stored in the input address register.

2. The memory system of claim 1, wherein the data structure comprises:
   a data input bus for receiving the write data word to be read into the memory; and
   a data output bus for receiving the read data word to be read out from the memory system.

3. The memory system of claim 1, wherein the data structure comprises a data input/output bus terminal for receiving the write data word to be read into the memory and for also receiving the read data word to be read out from the memory system.

4. The memory system of claim 1 wherein in a write operation immediately following a read operation, the random access memory system is capable of storing in the memory write data received in the memory system prior to the read operation, the write data being stored at an address in the memory corresponding to an address stored in the at least one logic address registers.

5. The memory system of claim 1, wherein the memory structure includes:
   an address port for receiving the address from the control logic;
   a data-in port for receiving the input data word from the control logic;
   a data-out port for sending the output data word to the control logic; and
   a control port for receiving the control lines from the control logic.

6. The memory system of claim 5, wherein the control logic is capable of placing in the data storage registers the write data word to be written into the memory in conformance with the write operation and, in the read request immediately following the write operation, is capable of reading out the bytes of data from the output data word of the memory if the address requested is one not stored in the control logic or the byte is not one to be written into the memory, and from the control logic if the address is one stored in the logic circuit and that byte of the write data word is to be written into the memory.

7. A synchronous random access memory system, comprising:
   a memory having a memory structure for receiving an input data word to be written into the memory and for receiving an output data word to be read out of the memory, the input data word and the output data word each consisting of at least two bytes, and the memory being capable of separately writing each byte of the input data word in response to a set of at least two control lines;

at least one data bus terminal for receiving a write data word to be written into the memory and for also receiving a read data word to be read out of the memory system, the write data word and the read data word each having at least two bytes;

an address bus terminal for receiving addresses for the write data word to be written into the memory and the read data word to be read out of the synchronous random access memory system; and a control terminal for receiving at least two control signals indicating individually whether each byte of the write data word is to be written into the memory or whether each byte of the read data word is to be read from the memory system;

wherein,
in a read operation, the synchronous random access memory system is capable of providing the read data word at the at least one data bus terminal, the read data word corresponding to an address in the synchronous random access memory system, in a write operation, the synchronous random access memory system is capable of storing the write data word received at the at least one data bus terminal, the write data word corresponding to an address in the synchronous random access memory system, and in the read operation following the write operation, the synchronous random access memory system is capable of outputting to the at least one data bus terminal the read data word, the read data word being formed from bytes of the write data word that the control signals indicate are to be stored into the memory in combination with bytes of the output data word read from the memory corresponding to bytes of the write data word that the at least two control signals indicate are not to be stored into the memory.

8. The memory system of claim 7, wherein in a write operation following a read operation, the synchronous random access memory system is capable of storing in the memory the write data word previously stored in the memory system corresponding to an address previously received on the address bus terminal and stored in the memory system and in response to the control signals previously stored in the memory system.

9. The memory system of claim 8, wherein in a read operation immediately following a read operation, the synchronous random access memory system is capable of outputting at the data bus terminal, the read data word from a combination of bytes stored within the memory and bytes stored outside the memory of the synchronous random access memory system.

10. The memory system of claim 9, wherein in a write operation immediately following a write operation, the random access memory system is capable of storing in the memory the write data previously stored in the memory system in response to the control signals previously stored in the memory system.

11. The memory system of claim 10, wherein the memory structure includes:
an address port;
a data-in port for receiving the input-data word;
a data-out port for receiving the output-data word; and
a control port for receiving the control lines.

12. The memory system of claim 11 and further comprising:
a control circuit coupled to the address bus terminal, the at least one bus terminal, the control terminal, the address port, the data-in port, the data-out port, and the control port wherein during a write operation, the control circuit is capable of storing an address received from the address bus terminal, a control signal received from the control terminal, and write data corresponding to the address from the data input/output bus terminal.

13. The memory system of claim 12, wherein the control circuit is capable of storing the write data in the memory during a write operation following the write operation during which the address, the control signal and the write data were stored in the input circuit, and wherein the control circuit is not capable of storing the write data in the memory during a read operation immediately following the write operation during which the address, the control signal and the write data were stored in the input circuit.

14. The memory system of claim 13 and further comprising:
a selection logic circuit coupled to the control circuit and the memory, wherein the selection logic circuit is capable of causing the random access memory system to output those bytes of the write data stored in the input circuit which are to be written into the memory when, during a read operation, the address of the read operation matches the address stored in the input circuit.

15. The memory system of claim 14, wherein the control circuit comprises:
an input address register having an input port and an output port, the input port being coupled to the address bus terminal;
a logic address register having an input port coupled to the output port of the input register and an output port coupled to the selection logic circuit;
an input control register having an input terminal coupled to the control terminal and an output terminal coupled to the selection logic circuit; and
a data register having an input port coupled to the at least one bus terminal for receiving the write data word and an output port coupled to the data-in port of the memory and to the selection logic circuit.

16. The memory system of claim 15, wherein the selection logic circuit comprises:
an address multiplexer having
a first input port coupled to the output port of the input address register;
a second input port coupled to the output port of the logic address register; and
an output port coupled to the address port of the memory;
a write enable circuit having an input terminal coupled to the output terminal of the input control register and having an output terminal coupled to the control port of the memory;
at least two output data multiplexers, each corresponding to one byte of the read word, each of the output data multiplexers having
a first input port coupled to the corresponding byte of the output data word at the data-out port of the memory, a second input port coupled to the corresponding byte of the write data word at the data register, an output port coupled to the corresponding byte of the read data word at the at least one bus terminal, and an input-select port which controls whether the first input port or the second input port of the output data multiplexer is coupled to the output port of the output data multiplexer;

at least two logic gates, corresponding to each of the output data multiplexers, each of the logic gates having a first input, a second input and an output, the first input being coupled to the output of the control signal corresponding to that byte of the write data word, and the output being coupled to the input-select port of the data multiplexer which corresponds to that byte of the read data word; and a comparator having a first input port coupled to the output port of the input address register, a second input port coupled to the output port of the logic address register, and an output port coupled to second input of each of the logic gates;

wherein the logic gates choose each individual byte of data to be read out of the memory system depending on whether the byte is stored in the control circuit or in the memory.

17. A synchronous random access memory system, comprising:

a memory array having:

an address port for receiving addresses for data to be written into or read from the memory array, the data having at least two bytes;

a control port for receiving write and read signals to cause data to be written into and read from the memory array, the data having at least two bytes and the write signals also indicating which bytes of the data are to be written into the memory array;

a data-in port for receiving data being written into the memory array; and a data-out port for outputting data being read out of the memory array;

a logic circuit;

a set of input registers, including:

an input address register for receiving an address corresponding to a write or read signal, the input address register having an output bus coupled by the logic circuit to the address port of the memory array; and a set of input control registers for receiving a set of write signals or read signals, the write signals indicating which bytes of data are to be written into the memory array, the input control registers having an output terminal coupled by the logic circuit to the control port;

at least one data bus for receiving data to be written into or read out of the memory system, the at least one data bus being coupled by the logic circuit to the data-out port of the memory array; and a first data register having an input bus coupled to the at least one data bus and an output bus coupled by the logic circuit to the data-in port.

18. The memory system of claim 17, wherein the logic circuit includes:

a logic address register for receiving an address from the input address register, the logic address register having an input bus coupled to the output bus of the input address register and an output bus;

a logic control register for receiving control signals from the input control register, the logic control register having an input bus coupled to the output bus of the input control register and an output bus; and a first comparator for comparing a first address in the input address register to a second address in the logic address register, and for producing a first signal if the first address equals the second address and for producing a second signal if the first address does not equal the second address.

19. The memory system of claim 18, wherein the logic circuit further includes:

a first multiplexer circuit having at least two first multiplexers, each first multiplexer for passing a corresponding byte of data stored in the first data register to the at least one data bus in response to a read signal in the input control registers when the first address equals the second address and the write signals indicate that the byte of data is to be stored in the memory array.

20. The memory system of claim 19, wherein the logic circuit includes:

a second multiplexer circuit for passing the first address to the address port when the input control register contains a read signal and for passing the second address to the address port when the input control register contains a write signal.

21. The memory system of claim 20, wherein the logic circuit includes:

an output buffer between the second multiplexer circuit and the at least one data bus.

22. The memory system of claim 21, wherein the output buffer is capable of assuming a high impedance or low impedance.

23. The memory system of claim 20, wherein the output buffer is a tristate buffer.

24. The memory system of claim 18, wherein the logic circuit includes:

a second logic address register having an input bus and an output bus, the input bus coupled to the output bus of the logic address register;

a second logic control register having an input bus and an output bus, the input bus coupled to the output bus of the logic control register, the output bus being coupled to the control port of the memory array; and a second comparator for comparing the first address in the input address register to a third address in the second logic address register, and for producing a first signal if the first address equals the third address and for producing a second signal if the first address does not equal the second address.

25. The memory system of claim 24, wherein the logic circuit includes a first multiplexer having a first input coupled to the output of the input address register, a second input coupled to the output of the second logic address register and an output coupled to the address port of the memory array.

26. The memory system of claim 25, wherein the logic circuit includes a second data register having an input bus coupled to the output bus of the first data register and an output bus coupled to the data-in port of the memory array.

27. The memory system of claim 26, wherein the logic circuit includes a second multiplexer for passing data on the first output register to the data-in port of the memory array or for passing data on the second output register to the data-in port of the memory array in response to a third input select signal.

28. The memory system of claim 27, further including an output register having an input bus and an output bus, the input bus being separable into at least two bytes and being coupled to the data-out port of the memory array, to the output bus of the first data register, to the output bus of the second data register and to the at least one data bus of the memory system.

29. The memory system of claim 28, wherein the logic circuit includes an output selection circuit coupled to the input bus of the output register, the output selection circuit being also coupled to the data-out port of the memory array, to the output bus of the first data register, to the output bus of the second data register and to the at least one data bus and the output selection circuit additionally coupled to the outputs of the first comparator, the second comparator, the logic control register and the second logic control register, the output selection circuit being capable of choosing individual bytes from the data-out port of the memory array, the output bus of the first data register, the output bus of the second data register and the at least one data bus for reading out to the output register.

30. The memory system of claim 29, wherein the output selection circuit comprises:

a first selection circuit, having a first selection multiplexer circuit, having a first input, a second input, an output and an input select, the first input being coupled to the data-out port of the memory array, the second input being coupled to the output bus of the second data register, the first selection multiplexer capable of independently choosing at least two bytes from the data-out port of the memory array or the output bus of the second data register, and a first selection logic circuit coupled to the input select of the first selection multiplexer circuit and also coupled with the outputs of the first comparator, the second comparator, the output port of the logic control register and the output port of the second logic control register;

a second selection circuit, having a second selection multiplexer circuit having, a first input, a second input, an output and an input select, the first input being coupled to the output of the first selection multiplexer circuit, the second input being coupled to the output bus of the first data register, the second selection multiplexer capable of independently choosing at least two bytes from the output of the first selection multiplexer or the output bus of the first data register, and a second selection logic circuit coupled to the input select of the second selection multiplexer circuit and also coupled with the outputs of the first comparator, the second comparator, the output port of the logic control register and the output port of the second logic control register; and a third selection circuit, having a third selection multiplexer circuit having a first input, a second input, an output and an input select, the first input being coupled to the output of the second selection multiplexer circuit, the second input being coupled to the at least one data bus, the second selection multiplexer capable of independently choosing at least two bytes from the output of the second selection multiplexer or the at least one data bus, the output of the third selection multiplexer circuit is coupled to the input bus of the output register, and a third selection logic circuit coupled to the input select of the second selection multiplexer circuit and also coupled with the outputs of the first comparator, the second comparator, the output port of the logic control register and the output port of the second logic control register.

* * * * *